United States Patent
Kurokawa

(10) Patent No.: US 10,055,232 B2
(45) Date of Patent: *Aug. 21, 2018

(54) SEMICONDUCTOR DEVICE COMPRISING MEMORY CIRCUIT

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 96 days.

This patent is subject to a terminal disclaimer.

(21) Appl. No.: 14/612,367

(22) Filed: Feb. 3, 2015

(65) Prior Publication Data

US 2015/0227379 A1 Aug. 13, 2015

(30) Foreign Application Priority Data

Feb. 7, 2014 (JP) ................. 2014-022305

(51) Int. Cl.
*G06F 9/00* (2006.01)
*G06F 15/177* (2006.01)
(Continued)

(52) U.S. Cl.
CPC .............. *G06F 9/4401* (2013.01); *G11C 7/20* (2013.01); *G11C 8/16* (2013.01); *G11C 11/16* (2013.01);
(Continued)

(58) Field of Classification Search
CPC ........... G06F 9/4401; G11C 7/20; G11C 8/16; G11C 11/16; G11C 11/1653;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Nitin Patel
(74) *Attorney, Agent, or Firm* — Fish & Richardson P.C.

(57) ABSTRACT

A semiconductor device in which the area of a circuit that is not in use during normal operation can be reduced is provided. A semiconductor device including a memory circuit has a function of storing a start-up routine in the memory circuit and executing the start-up routine; a function of operating the memory circuit as a buffer memory device after executing the start-up routine; and a function of loading the start-up routine into the memory circuit from the outside before the semiconductor device is powered off. The memory circuit has a plurality of groups each including at least a first transistor, a second transistor, and a memory element including an MTJ element. The memory element has a function of storing a signal input through the first transistor. The second transistor has a function of being turned on or off in accordance with the signal stored in the memory elements.

20 Claims, 16 Drawing Sheets

(51) Int. Cl.
| | | |
|---|---|---|
| G06F 9/4401 | (2018.01) | |
| G11C 11/16 | (2006.01) | |
| G11C 7/20 | (2006.01) | |
| G11C 8/16 | (2006.01) | |
| G11C 14/00 | (2006.01) | |
| G11C 16/08 | (2006.01) | |
| H01L 43/08 | (2006.01) | |
| H01L 27/22 | (2006.01) | |

(52) U.S. Cl.
CPC ...... *G11C 11/1653* (2013.01); *G11C 11/1655* (2013.01); *G11C 11/1657* (2013.01); *G11C 11/1659* (2013.01); *G11C 14/0081* (2013.01); *G11C 16/08* (2013.01); *H01L 27/228* (2013.01); *H01L 43/08* (2013.01); *G11C 2213/74* (2013.01); *G11C 2213/79* (2013.01)

(58) Field of Classification Search
CPC ............ G11C 11/1655; G11C 11/1657; G11C 11/1659; G11C 14/0081; G11C 16/08; G11C 2213/74; G11C 2213/79; G11C 11/00; H01L 27/228; H01L 43/08
USPC .......................................................... 713/2
See application file for complete search history.

(56) References Cited

U.S. PATENT DOCUMENTS

| | | | |
|---|---|---|---|
| 6,209,088 B1 * | 3/2001 | Reneris | G06F 1/3203 713/1 |
| 6,282,644 B1 * | 8/2001 | Ko | G06F 9/4403 711/E12.017 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,883,092 B2 | 4/2005 | Sasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,598,769 B2 | 10/2009 | Leung | |
| 7,674,650 B2 | 3/2010 | Akimoto et al. | |
| 7,732,819 B2 | 6/2010 | Akimoto et al. | |
| 8,675,382 B2 | 3/2014 | Kurokawa et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0094486 A1 * | 4/2007 | Moore | G06F 9/4401 713/1 |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0255325 A1 * | 10/2011 | Nagatsuka | G11C 11/405 365/72 |
| 2012/0020159 A1 * | 1/2012 | Ong | G11C 14/0081 365/185.08 |
| 2012/0311365 A1 * | 12/2012 | Yoneda | G06F 1/3243 713/324 |
| 2014/0032890 A1 * | 1/2014 | Lee | G06F 9/4401 713/2 |
| 2015/0207509 A1 | 7/2015 | Kurokawa | |
| 2015/0227378 A1 | 8/2015 | Kurokawa | |
| 2015/0229309 A1 | 8/2015 | Kurokawa | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-196097 A | 7/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 5, pp. 115-116.

Costello.M et al., "Electron Microscopy of a Cholesteric Liquid Crystal and Its Blue Phase", Phys. Rev. A (Physical Review. A), May 1, 1984, vol. 29, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performances TFT", SID Digest '07 : SID International Symposium Digest of Technical Papers, 2007, vol. pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications-"SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel, YBFE2O4, and YB2FE3)7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000 ° C", Journal of Solid State Chemistry, 1985, vol. 60, pp. 382-384.

Kimizuka.N. et al., "Syntheses and Single-Crystal Data of Homologous Compounds, In2O3(ZnO)m (m= 3, 4, and 5), InGaO3(ZnO)3, and Ga2O3(ZnO)m (m=7, 8, 9, and 16) in the In2O3—ZnGa2O4—ZnO System"Journal of Solid State Chemistry, apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IgZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350°C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters) Jul. 31, 2000, vol. 85, No. 5, pp. 1012-1015.
Noguchi.H et al., "Variable Nonvolatile Memory Arrays for Adaptive Computing Systems", IEDM 13: Technical Digest of International Electron Devices Meeting, Dec. 9, 2013, pp. 617-620.

* cited by examiner

21

SEMICONDUCTOR DEVICE COMPRISING MEMORY CIRCUIT

BACKGROUND OF THE INVENTION

1. Field of the Invention

One embodiment of the present invention relates to a semiconductor device including a memory circuit. Alternatively, one embodiment of the present invention relates to a semiconductor device including a memory circuit and a programmable logic device in which the configuration of hardware can be changed.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

2. Description of the Related Art

A processor executes a program called a start-up routine when it is booted. Although it depends on the environment in which the processor executes a program, the start-up routine includes processes necessary before the main routine is executed, such as setting a variety of registers, copying minimally necessary programs from a memory device outside the processor into a cache memory, and setting the cache memory to a usable state. A specific example of the setting of a variety of registers is a setting for an external peripheral device connected to the processor, such as a latency setting for a DRAM that is a main memory device.

In many cases, the start-up routine is stored in a nonvolatile memory device outside the processor. A mask ROM, a PROM, an EPROM, a flash memory, or the like is normally used as a nonvolatile memory device for storing the start-up routine. Patent Document 1 discloses a processor which includes a power-on determination circuit for determining whether power has been turned on for a system or for periodic operation and therefore does not require an operation to read table data of initial values from a boot ROM when power has been turned on for the periodic operation.

REFERENCE

[Patent Document 1] Japanese Published Patent Application No. 2003-196097

SUMMARY OF THE INVENTION

The boot time of the processor depends on the speed of reading data from the nonvolatile memory where the start-up routine is stored. Therefore, a structure in which the processor and the nonvolatile memory where the start-up routine is stored are contained in the same chip can increase the speed of data reading and is thus effective in shortening the boot time of the processor. Although the nonvolatile memory is needed when the start-up routine is executed, i.e., when the processor is booted, the nonvolatile memory is unnecessary after the processor is booted and starts normal operation. In this regard, the structure in which the nonvolatile memory and the processor are contained in the same chip might cause a decrease in area efficiency and an increase in chip cost.

In view of the foregoing technical background, an object of one embodiment of the present invention is to provide a semiconductor device in which the footprint of a circuit not used in normal operation is reduced.

It is an object of one embodiment of the present invention to provide a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

A semiconductor device in one embodiment of the present invention includes a first circuit, a second circuit, a third circuit, a fourth circuit, a fifth circuit, a sixth circuit, and a seventh circuit. The first circuit has a function of storing a program in a first period and a function of operating as a buffer memory device for the second circuit in a second period. The second circuit has a function of executing the program in the second period. The first period includes a period in which the supply of first power is stopped. The second period includes a period in which the first power is supplied. The third circuit has a function of measuring the length of the first period. The fourth circuit has a function of operating to start the supply of the first power to the second circuit when the second period starts. The fifth circuit has a function of storing data on the length of the first period measured by the third circuit. The sixth circuit has a function of determining whether data requested by the second circuit is stored in the first circuit or not in the case where the first circuit operates as the buffer memory device. The seventh circuit has a function of supplying second power to the fourth circuit and the fifth circuit. The first circuit includes a plurality of eighth circuits. The plurality of eighth circuits each include a first transistor, a second transistor, and a memory element. The memory element includes an MTJ element. The memory element has a function of storing a signal input through the first transistor. The second transistor has a function of being turned on or off in accordance with the signal stored in the memory element.

The semiconductor device according to one embodiment of the present invention is a semiconductor device including a memory circuit. The semiconductor device has a function of storing a start-up routine in the memory circuit and executing the start-up routine, a function of operating the memory circuit as a buffer memory device after executing the start-up routine, and a function of loading the start-up routine into the memory circuit from outside before the semiconductor device is powered off. The memory circuit has a plurality of groups each including at least a first transistor, a second transistor, and a memory element. The memory element includes an MTJ element. The memory element has a function of storing a signal input through the first transistor. The second transistor has a function of selecting on state or off state in accordance with the signal stored in the memory element.

The semiconductor device may have a function of measuring the length of the period in which the supply of power is stopped, and a function of comparing the length of the period in which the supply of power is stopped with the length of a preset period after the power is supplied and executing the start-up routine after loading the start-up routine into the memory circuit from outside when the period in which the supply of power is stopped is longer than the preset period or executing the start-up routine stored in the memory circuit when the period in which the supply of power is stopped is shorter than the preset period.

One embodiment of the present invention can provide a semiconductor device in which the footprint of a circuit not used in normal operation can be reduced.

One embodiment of the present invention can provide a novel semiconductor device or the like. Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Embodiments of the present invention will be described in detail below with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that a "source" of a transistor in this specification means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Structural Example 1 of Semiconductor Device

Figure 1:
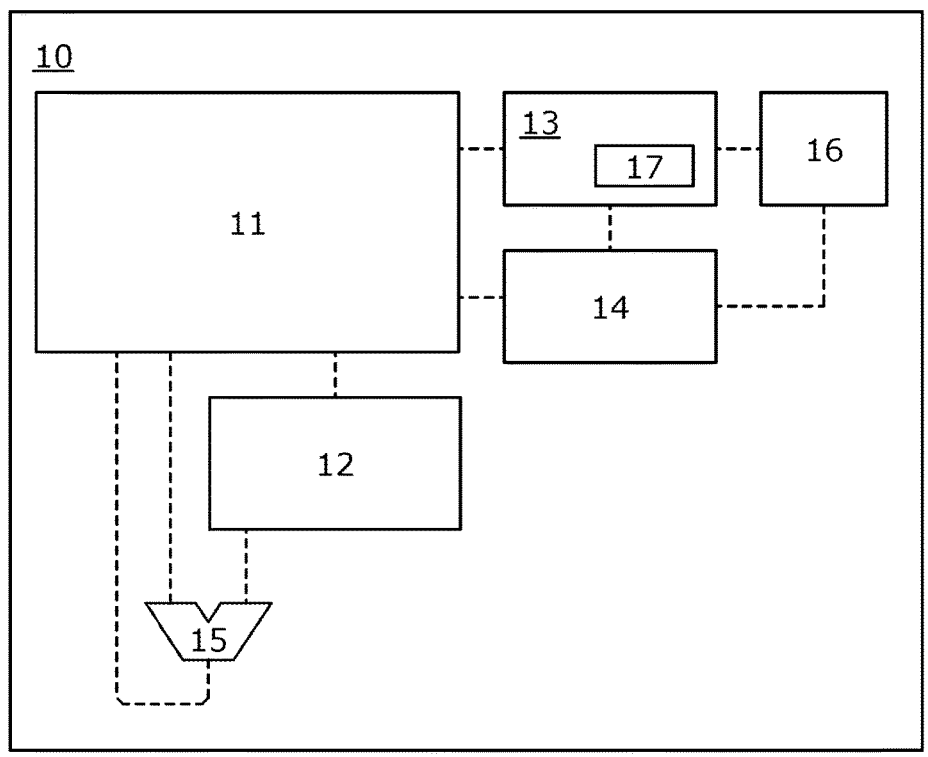
FIG. 1 illustrates a structure of a semiconductor device.

First, a structure example of a semiconductor device of one embodiment of the present invention will be described. FIG. 1 illustrates a structure of a semiconductor device 10 of one embodiment of the present invention.

The semiconductor device 10 in FIG. 1 includes a processor 11, a memory circuit 12, a power management unit (PMU) 13, a register 14, a comparator circuit 15, and a power supply 16.

The processor 11 has a function of executing a variety of programs by controlling the overall operations of the memory circuit 12, the PMU 13, the register 14, and the like. The memory circuit 12 has a function of storing a variety of data. The memory circuit 12 can retain data stored therein even in a period where the supply of power to the memory circuit 12 is stopped. A specific structure of the memory circuit 12 and an operation thereof will be described later. In one embodiment of the present invention, the memory circuit 12 can store data on a start-up routine to be executed when the processor 11 is booted. In addition, in one embodiment of the present invention, the memory circuit 12 can function as a buffer memory device (cache memory) of the processor 11 after the processor 11 is booted. In the case where the memory circuit 12 functions as a buffer memory device of the processor 11, the memory circuit 12 may store a variety of programs to be executed by the processor 11, data used for a variety of arithmetic operations performed by the processor 11, data obtained by the variety of arithmetic operations, or the like.

Note that the processor 11 may have another function, or may lack part of the function, for example. Therefore, the processor 11 may be referred to simply as a circuit, or may be referred to as a first circuit, a second circuit, or the like.

Note that the memory circuit 12 may have another function, or may lack part of the function, for example. Therefore, the memory circuit 12 may be referred to simply as a circuit, or may be referred to as a first circuit, a second circuit, or the like.

The comparator circuit 15 has a function of determining whether data requested by the processor 11 is stored in the memory circuit 12 or not in the case where the memory circuit 12 functions as a buffer memory device.

Note that the comparator circuit 15 may have another function, or may lack part of the function, for example. Therefore, the comparator circuit 15 may be referred to simply as a circuit, or may be referred to as a first circuit, a second circuit, or the like.

The PMU 13 has a function of operating to start the supply of power to the processor 11 and the memory circuit 12 when the supply of power to the semiconductor device 10 from outside is started. Furthermore, the PMU 13 may have a function of operating to start the supply of a variety of drive signals, such as a clock signal, necessary for the operation of the processor 11 or the memory circuit 12 to the processor 11 or the memory circuit 12 when the supply of power to the semiconductor device 10 is started.

The PMU 13 includes a counter 17. The counter 17 has a function of measuring a period in which the supply of power to the semiconductor device 10 from outside is stopped. The register 14 has a function of storing data on the measured period. Note that although FIG. 1 illustrates an example of the semiconductor device 10 in which the counter 17 is a component of the PMU 13, the counter 17 may be separate from the PMU 13 in the semiconductor device 10. Although FIG. 1 illustrates an example in which the register 14 is separate from the PMU 13 in the semiconductor device 10, the register 14 may be a component of the PMU 13.

Note that the PMU 13 may have another function, or may lack part of the function, for example. Therefore, the PMU 13 may be referred to simply as a circuit, or may be referred to as a first circuit, a second circuit, or the like.

Note that the counter 17 may have another function, or may lack part of the function, for example. Therefore, the counter 17 may be referred to simply as a circuit, or may be referred to as a first circuit, a second circuit, or the like.

In addition to the data on the above period, the register 14 may store data for determining whether to load the start-up routine into the memory circuit 12 from the outside of the semiconductor device 10 when the supply of power to the semiconductor device 10 from outside is resumed.

Note that the register 14 may have another function, or may lack part of the function, for example. Therefore, the register 14 may be referred to simply as a circuit, or may be referred to as a first circuit, a second circuit, or the like.

The power supply 16 has a function of supplying power to the PMU 13 and the register 14 in a period where the supply of power to the semiconductor device 10 from outside is stopped. In the case where the counter 17 is separate from the PMU 13 in the semiconductor device 10, the power supply 16 has a function of supplying power to the counter 17 in addition to the PMU 13 and the register 14 in the period where the supply of power to the semiconductor device 10 from outside is stopped.

As the power supply 16, specifically, a primary battery, a power storage device such as a capacitor or a secondary battery, or the like can be used. As the secondary battery, a lead-acid battery, a nickel-cadmium battery, a nickel-hydride battery, or a lithium-ion battery can be used, for example. As the capacitor, an electric double layer capacitor, or a hybrid capacitor in which one of a pair of electrodes has an electric double layer structure and the other of the pair of electrodes utilizes an oxidation-reduction reaction, can be used, for example. The hybrid capacitor, for example, includes a lithium ion capacitor in which a positive electrode has an electric double layer structure and a negative electrode has a lithium ion secondary battery structure. In the case where the power storage device such as the capacitor or the secondary battery is used as the power supply 16, a charge control circuit for preventing overcharge or overdischarge of the power storage device may be provided in the semiconductor device 10.

The power supply 16 may include a circuit such as a DC-DC converter, a step-up circuit, or a step-down circuit. That is, the power supply 16 may have a function of generating a plurality of potentials. In that case, the power supply 16 can have a function of a power supply circuit.

The power supply 16 may have a function of receiving power wirelessly. That is, the power supply 16 may be charged with power that is supplied from outside through the use of a magnetic field, an electric field, an electromagnetic field, or the like. Therefore, the power supply 16 may include a rectifier circuit, a smoothing circuit, or the like. Alternatively, the power supply 16 may include an AC-DC converter or the like.

Note that the power supply 16 is not necessarily provided in the semiconductor device 10. The power supply 16 may be provided outside the semiconductor device 10, or a power supply which supplies power to the semiconductor device 10 may be used in addition to the power supply 16. That is, a power supply which supplies power to the PMU 13 and the register 14 and a power supply which supplies power to the other components may be separately provided. Alternatively, a single power supply may be provided to supply power to the PMU 13, the register 14, and the other components, and the supply of power to each component may be individually controlled. For example, the supply of power may be controlled such that power is supplied only to the PMU 13, the register 14, and the like and not to the other components.

Note that the power supply 16 may have another function, or may lack part of the function, for example. Therefore, the power supply 16 may be referred to simply as a circuit, or may be referred to as a first circuit, a second circuit, or the like.

<Operation Example of Semiconductor Device>

Next, an operation example of the semiconductor device 10 illustrated in FIG. 1 will be described using a flowchart in FIG. 2.

Figure 2:
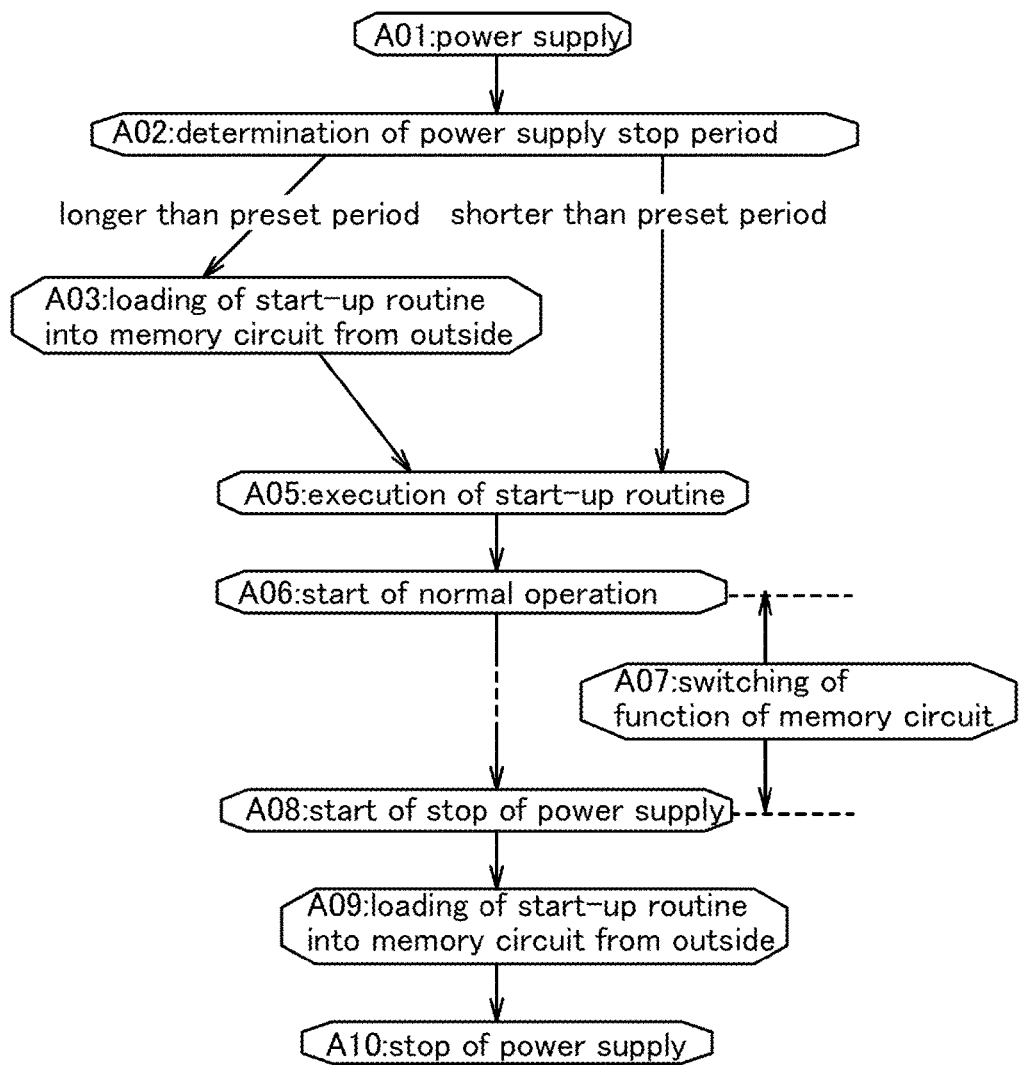
FIG. 2 is a flowchart illustrating the flow of operation of a semiconductor device.

First, as shown in FIG. 2, the supply of power to the semiconductor device 10 is started (A01: power supply). When the supply of power to the semiconductor device 10 is started, the PMU 13 operates to start the supply of power to the processor 11 and the memory circuit 12. The PMU 13 may operate to start the supply of a drive signal to the processor 11 and the memory circuit 12.

Next, the PMU 13 determines whether a period where the supply of power to the semiconductor device 10 is stopped is longer than or shorter than a preset period (A02: determination of power supply stop period). The preset period is preferably set so as to be as long as or shorter than a period where the start-up routine stored in the memory circuit 12 can be retained therein after the supply of power to the memory circuit 12 is stopped.

In the case where the period where the supply of power to the semiconductor device 10 is stopped is longer than the preset period, it is highly likely that the start-up routine is not stored in the memory circuit 12. Therefore, the PMU 13 operates to load the start-up routine into the memory circuit 12 from the outside of the semiconductor device 10 (A03: loading of start-up routine into memory circuit from outside).

In the case where the period where the supply of power to the semiconductor device 10 is stopped is shorter than the preset period, it is highly likely that the start-up routine is stored in the memory circuit 12. Therefore, the PMU 13 operates so that the processor 11 executes the start-up routine stored in the memory circuit 12.

Note that, for example, in the case where the period where the supply of power is stopped can be accurately estimated, whether to load the start-up routine into the memory circuit 12 from the outside of the semiconductor device 10 after the supply of power is resumed can be predetermined before the supply of power is stopped. In that case, data for determining whether to load the start-up routine into the memory circuit 12 from outside (hereinafter referred to as determination data) may be stored in the register 14. With the use of the determination data, it is possible to predetermine whether to load the start-up routine into the memory circuit 12 from the outside of the semiconductor device 10, without determining whether the period where the supply of power to the semiconductor device 10 is stopped is longer than or shorter than the preset period (A02: determination of power supply stop period). Specifically, the PMU 13 can operate, according to the determination data from the register 14, to perform the operation of loading the start-up routine into the memory circuit 12 from the outside of the semiconductor device 10 (A03: loading of start-up routine into memory circuit from outside).

Even in the case where the determination data is stored in the register 14, when the period where the supply of power to the semiconductor device 10 is stopped is longer than the preset period, it is more likely that the start-up routine is not stored in the memory circuit 12. In this case, a valid bit which indicates whether the determination data is valid or invalid may be stored in the memory circuit 12; when the valid bit is invalid, the operation of loading the start-up routine into the memory circuit 12 (A03: loading of start-up routine into memory circuit from outside) is forcibly selected. For example, in the case where a valid bit having a logical value of "1" which indicates that the valid bit is valid, as well as the determination data, is stored in the memory circuit 12, when the determination data is lost, the logical value of the valid bit changes from the logical value "1" which indicates that the valid bit is valid to a logical value of "0" which indicates that it is invalid, whereby the determination data can be determined to be invalid.

Next, the processor 11 executes the start-up routine (A05: execution of start-up routine). By executing the start-up routine, the processor 11 is booted, i.e., becomes capable of executing a variety of programs.

Figure 3:
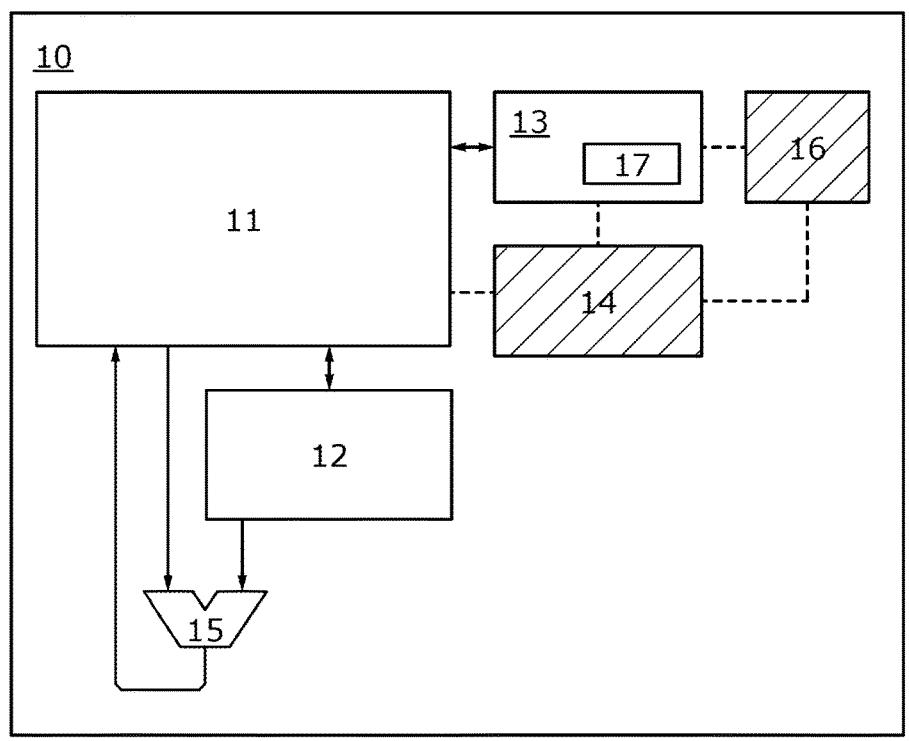
FIG. 3 illustrates an operation of a semiconductor device.

Next, the semiconductor device 10 starts normal operation (A06: start of normal operation). In one embodiment of the present invention, after the semiconductor device 10 starts normal operation, the function of the memory circuit 12 can be switched (A07: switching of function of memory circuit). Specifically, after the semiconductor device 10 starts normal operation, the memory circuit 12 can function as a buffer memory device of the processor 11. Then, when the stop of the supply of power to the semiconductor device 10 is started (A08: start of stop of power supply), the function of the memory circuit 12 is switched to the original function of storing the start-up routine FIG. 3 schematically illustrates an operation of the semiconductor device 10 in which the memory circuit 12 functions as the buffer memory device of the processor 11. As illustrated in FIG. 3, in the semiconductor device 10, the processor 11, the memory circuit 12, the comparator circuit 15, and the PMU 13 are in an operating state, i.e., in a state of being supplied with power and a drive signal. In the case where the counter 17 is separate from the PMU 13 in the semiconductor device 10, the counter 17 is not necessarily in the operating state. In the case where the memory circuit 12 functions as the buffer memory device of the processor 11, power is supplied to the semiconductor device 10 from outside; therefore, power is not necessarily supplied from the power supply 16 to the PMU 13 and the register 14.

For example, when the processor 11 requests access to data in the memory circuit 12, low-order and high-order bits of an address of the data are sent to the memory circuit 12 and the comparator circuit 15, respectively. The memory circuit 12 sends, to the comparator circuit 15, high-order bits (also referred to as tag data) of an address stored in a line corresponding to the low-order bits of the address to which access is requested. The comparator circuit 15 compares the high-order bits of the address to which access is requested by the processor 11 with the high-order bits of the address sent from the memory circuit 12. As a result of comparison, when the high-order bits of the addresses match with each other, the data is stored in the line corresponding to the low-order bits of the address to which access is requested by the processor 11. When the high-order bits of the addresses do not match with each other, the data to which access is requested is not stored in the memory circuit 12. In the case where the data is stored in the memory circuit 12, the data is sent to the processor 11.

Next, the start-up routine is loaded from the outside of the semiconductor device 10 and stored in the memory circuit 12 (A09: loading of start-up routine into memory circuit from outside). Then, the supply of power to the semiconductor device 10 is stopped (A10: stop of power supply).

In the case where the start-up routine is stored in the memory circuit 12 before the supply of power is stopped, the start-up routine does not need to be loaded into the memory circuit 12 from outside when the supply of power to the semiconductor device 10 is resumed (A01: power supply) and the period where the supply of power is stopped is determined (A02: determination of power supply stop period) to be shorter than the preset period. This can reduce the time it takes to boot the processor 11.

Figure 4:
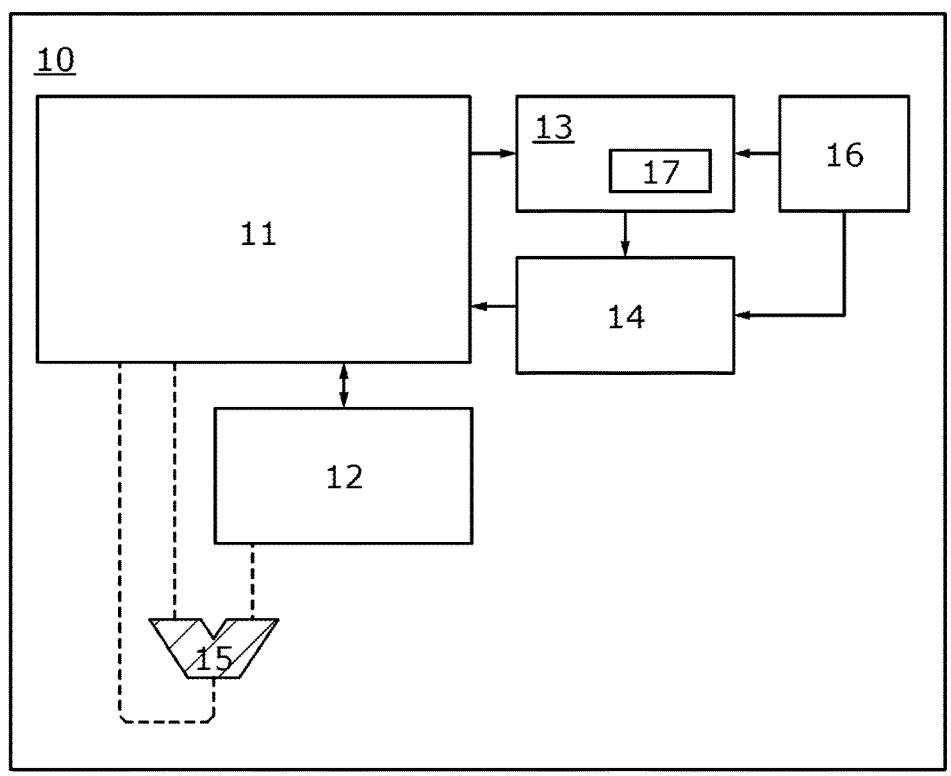
FIG. 4 illustrates an operation of a semiconductor device.

FIG. 4 schematically illustrates an operation of the semiconductor device 10 in which the memory circuit 12 has a function of storing the start-up routine. As illustrated in FIG. 4, in the semiconductor device 10, the processor 11, the memory circuit 12, the PMU 13, and the register 14 are in an operating state. In the case where the counter 17 is separate from the PMU 13 in the semiconductor device 10, the counter 17 is also in the operating state. In the case where the memory circuit 12 has a function of storing the start-up routine, power is supplied to the semiconductor device 10 from outside in some cases and not in others. In the case where power is supplied to the semiconductor device 10, power is not necessarily supplied from the power supply 16 to the PMU 13 and the register 14. In the case where power is not supplied to the semiconductor device 10, power is supplied from the power supply 16 to the PMU 13 and the register 14.

Note that in the case where whether to load the start-up routine from outside is predetermined according to the determination data after the supply of power to the semiconductor device 10 is resumed (A01: power supply), the determination data is stored in the register 14 after the stop of the supply of power to the semiconductor device 10 is started (A08: start of stop of power supply) and before the supply of power to the semiconductor device 10 is stopped (A10: stop of power supply).

The determination data may be created according to an instruction that is input to the semiconductor device 10 by a user via an input device of the semiconductor device 10. As the input device, a keyboard, a pointing device, a touch panel, a sensor, or the like can be used.

In the case where a power storage device is used as the power supply 16, power may be supplied to the power storage device in a period where power is supplied to the semiconductor device 10.

Structural Example 2 of Semiconductor Device

Figure 5:
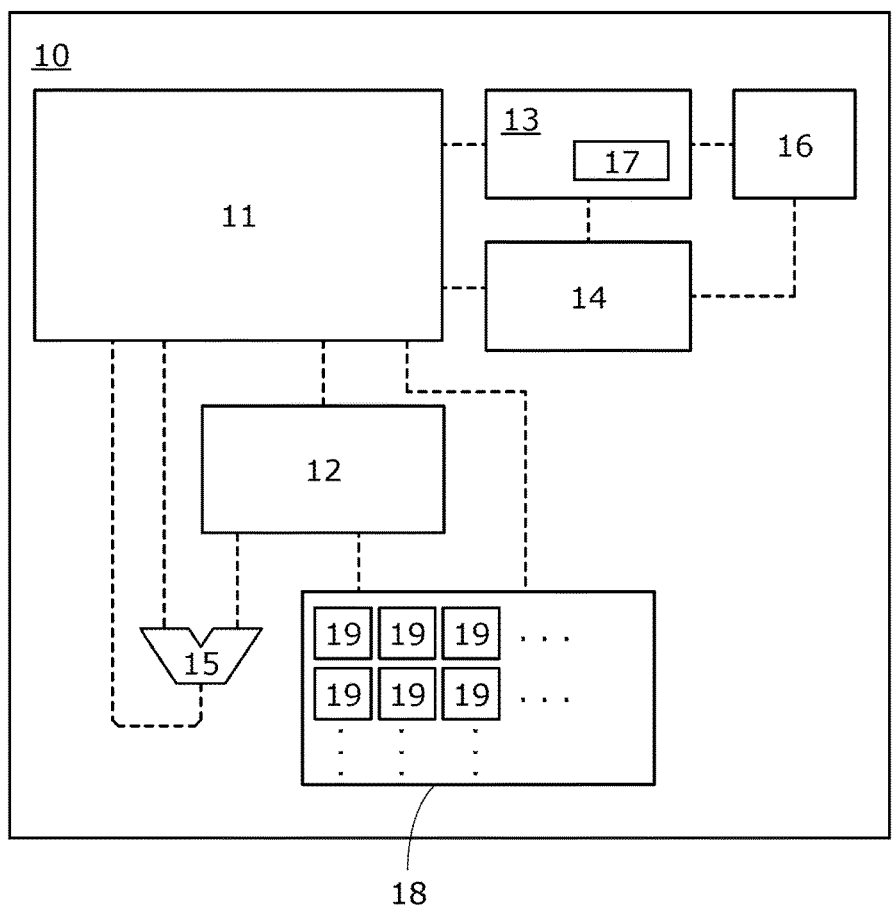
FIG. 5 illustrates a structure of a semiconductor device.

Next, a structural example of a semiconductor device of one embodiment of the present invention, which is different from that in FIG. 1, will be described. FIG. 5 illustrates a structure of a semiconductor device 10 of one embodiment of the present invention.

Like the semiconductor device 10 in FIG. 1, the semiconductor device 10 in FIG. 5 includes a processor 11, a memory circuit 12, a power management unit (PMU) 13, a register 14, a comparator circuit 15, and a power supply 16. In addition, the semiconductor device 10 in FIG. 5 includes a logic circuit 18, and the logic circuit 18 includes a plurality of circuits 19.

In the semiconductor device 10 in FIG. 5, as in the semiconductor device 10 in FIG. 1, the memory circuit 12 can store data on a start-up routine to be executed when the processor 11 is booted. In the semiconductor device 10 in FIG. 5, as in the semiconductor device 10 in FIG. 1, the memory circuit 12 can function as a buffer memory device of the processor 11 after the processor 11 is booted. Furthermore, in the semiconductor device 10 in FIG. 5, the memory circuit 12 can store data for controlling electrical connection between the plurality of circuits 19 (hereinafter referred to as configuration data). By controlling electrical connection between the plurality of circuits 19 according to the configuration data stored in the memory circuit 12, the logic circuit 18 can have additional functions of a variety of sequential circuits and combination circuits.

The semiconductor device 10 in FIG. 5 may have a structure with which the kind of logic operation of the circuit 19, specifically, the logical value of an output signal corresponding to the logical value of an input signal of the circuit 19, is determined according to configuration data. When the kind of logic operation of each of the plurality of circuits 19 is changed, the logic circuit 18 can have additional functions of a greater variety of sequential circuits and combination circuits.

In the semiconductor device 10 in FIG. 5, the memory circuit 12 may have a function of a switch for controlling electrical connection between the plurality of circuits 19 according to the configuration data, in addition to the function of storing the configuration data.

Figure 6:
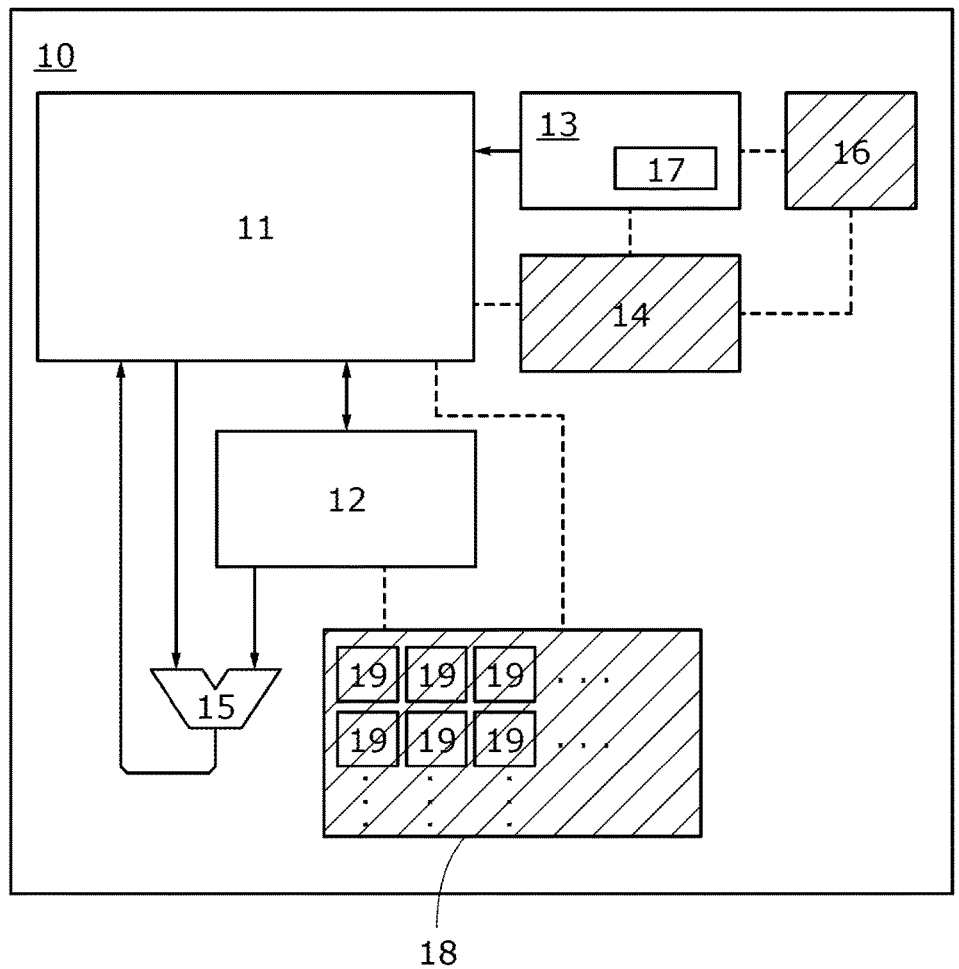
FIG. 6 illustrates an operation of a semiconductor device.

FIG. 6 schematically illustrates an operation of the semiconductor device 10 in FIG. 5 in which the memory circuit 12 functions as the buffer memory device of the processor 11. As illustrated in FIG. 6, in the semiconductor device 10, the processor 11, the memory circuit 12, the comparator circuit 15, and the PMU 13 are in an operating state. In the case where the counter 17 is separate from the PMU 13 in the semiconductor device 10, the counter 17 is not necessarily in the operating state. In the case where the memory circuit 12 functions as the buffer memory device of the processor 11, power is supplied to the semiconductor device 10 from outside; therefore, power is not necessarily supplied from the power supply 16 to the PMU 13 and the register 14.

Figure 7:
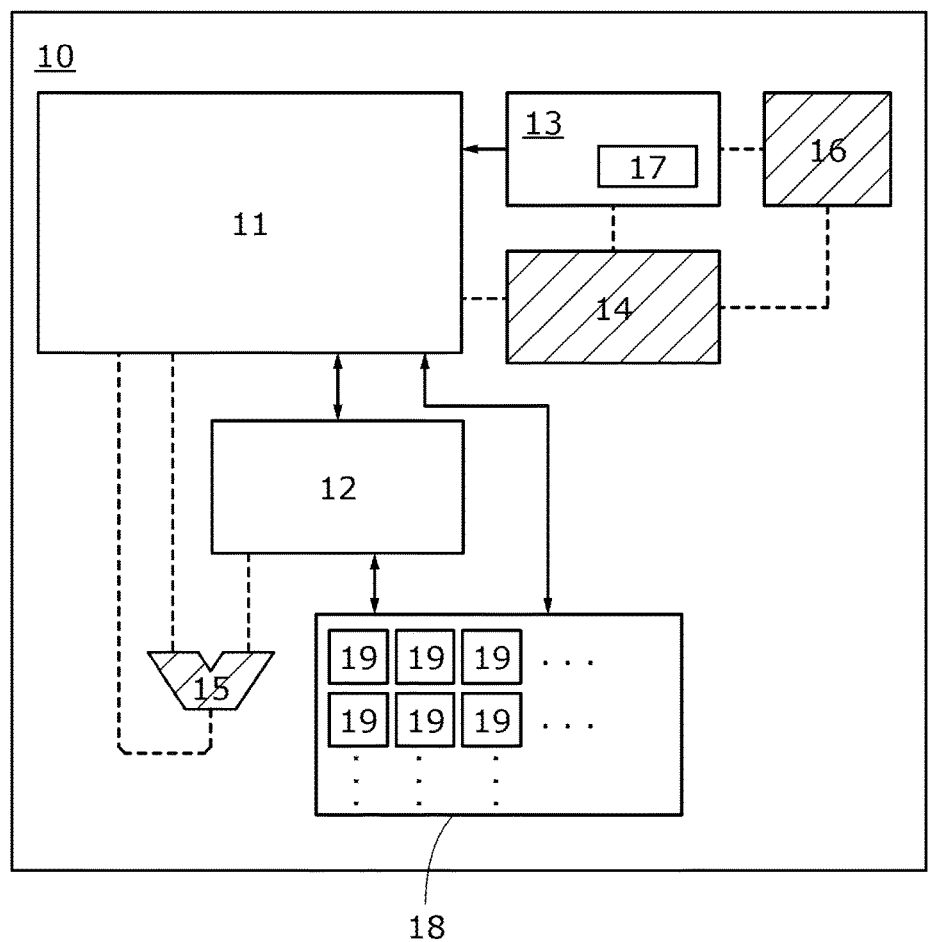
FIG. 7 illustrates an operation of a semiconductor device.

FIG. 7 schematically illustrates an operation of the semiconductor device 10 in FIG. 5 in which the memory circuit 12 has a function of storing the configuration data. As illustrated in FIG. 7, in the semiconductor device 10, the processor 11, the memory circuit 12, the PMU 13, and the logic circuit 18 are in an operating state. In the case where the counter 17 is separate from the PMU 13 in the semiconductor device 10, the counter 17 is not necessarily in the operating state. In the case where the memory circuit 12 has a function of storing the configuration data, power is supplied to the semiconductor device 10 from outside; therefore, power is not necessarily supplied from the power supply 16 to the PMU 13 and the register 14.

Figure 8:
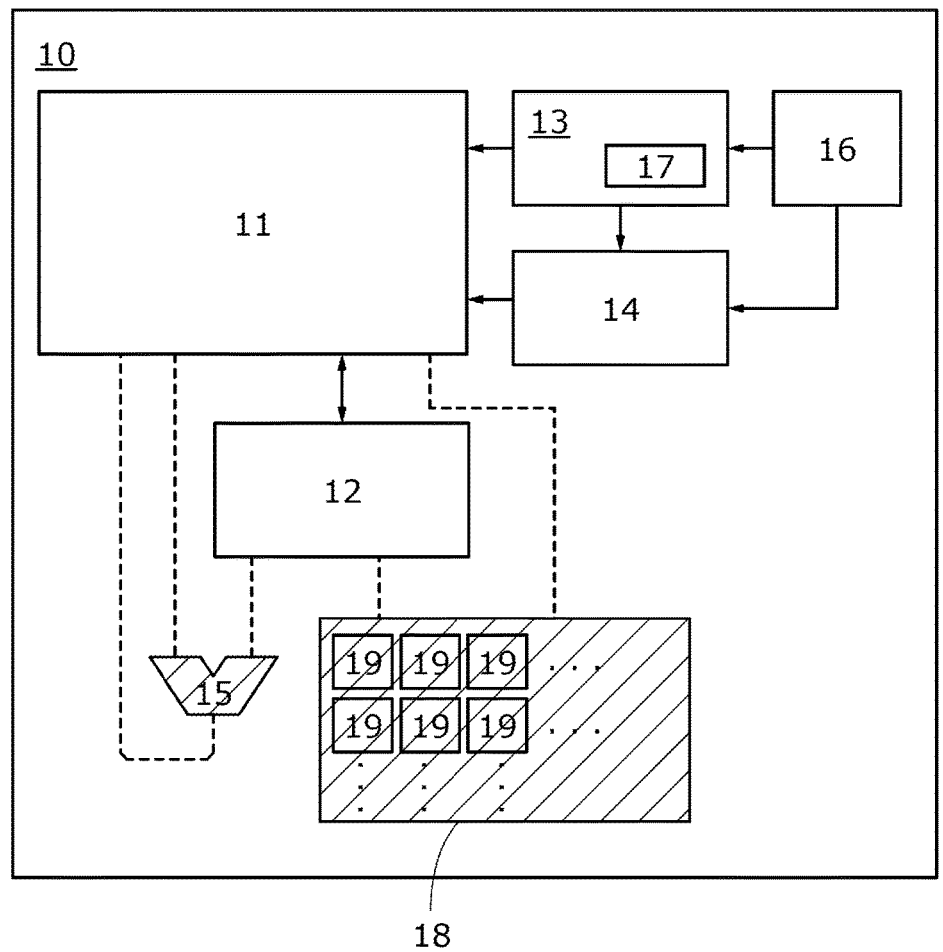
FIG. 8 illustrates an operation of a semiconductor device.

FIG. 8 schematically illustrates an operation of the semiconductor device 10 in FIG. 5 in which the memory circuit 12 has a function of storing the start-up routine. As illustrated in FIG. 8, in the semiconductor device 10, the processor 11, the memory circuit 12, the PMU 13, and the register 14 are in an operating state. In the case where the counter 17 is separate from the PMU 13 in the semiconductor device 10, the counter 17 is also in the operating state. In the case where the memory circuit 12 has a function of storing the start-up routine, power is supplied to the semiconductor device 10 from outside in some cases and not in others. In the case where power is supplied to the semiconductor device 10, power is not necessarily supplied from the power supply 16 to the PMU 13 and the register 14. In the case where power is not supplied to the semiconductor device 10, power is supplied from the power supply 16 to the PMU 13 and the register 14.

Note that FIGS. 6 and 7 schematically illustrate operations in which the memory circuit 12 functions as the buffer memory device of the processor 11 and in which the memory circuit 12 has a function of storing the configuration data, respectively. However, in one embodiment of the present invention, a portion of the memory circuit 12 may function as the buffer memory device of the processor 11, and another portion of the memory circuit 12 may have a function of storing the configuration data.

<Structural Example of Memory Circuit>

Next, a specific structural example of the memory circuit 12 including a cell array 20 will be described.

Figure 9:
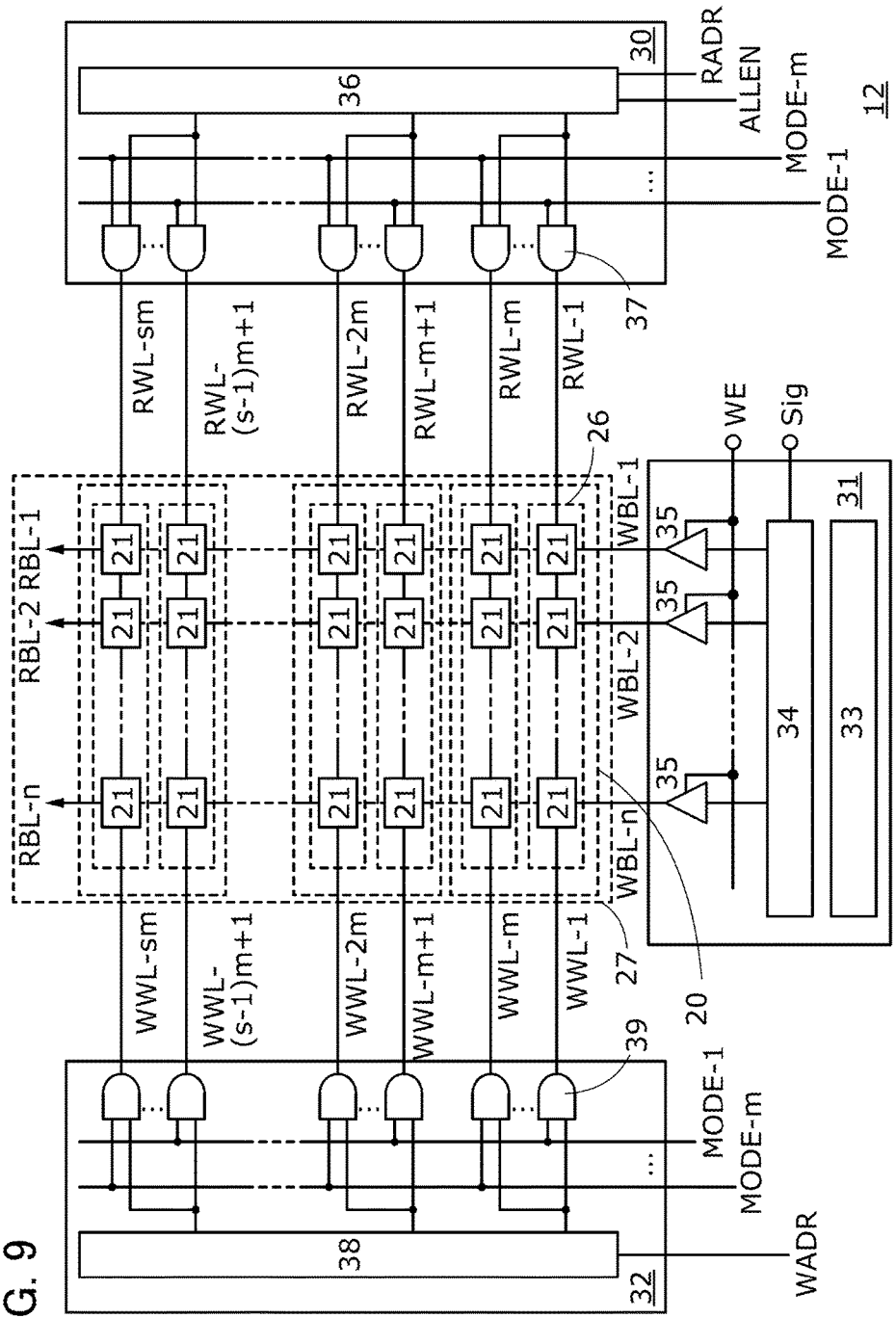
FIG. 9 illustrates a structural example of a memory circuit.

The memory circuit 12 illustrated in FIG. 9 includes a cell array 27 that has the cell arrays 20, a driver circuit 30 that has a function of controlling the supply of potentials to the wirings RWL, a driver circuit 31 that has a function of controlling the supply of signals containing data to the wirings WBL, and a driver circuit 32 that has a function of controlling the supply of potentials to the wirings WWL. Note that s cell arrays 20 (s is a natural number greater than or equal to 2) are provided in the direction that the wirings WBL extend.

Note that the driver circuit 30, the driver circuit 31, or the driver circuit 32 may have another function, or may lack part of the function, for example. Therefore, the driver circuit 30, the driver circuit 31, or the driver circuit 32 may be referred to simply as a circuit, or may be referred to as a first circuit, a second circuit, or the like.

The driver circuit 31 includes a circuit 33 which includes a shift register, a decoder, or the like and which has a function of controlling the timing of sampling a signal Sig containing data; a circuit 34 which has a function of sampling the signal Sig at the timing determined by the circuit 33; and a plurality of switches 35 each of which has a function of controlling the supply of the sampled signal to the wiring WBL. FIG. 9 illustrates the case where a three-state buffer, the impedance of which is set high in accordance with a signal WE, is used as each of the switches 35.

Specifically, in FIG. 9, when the potential of the signal WE is at a high level, the switches 35 supply signals with the same logical values as signals input to input terminals to the wirings WBL. On the other hand, when the potential of the signal WE is at a low level, the switches 35 have high impedance and the signals input to the input terminals are not supplied to the wirings WBL.

In the case where the memory circuit 12 functions as a buffer memory device, or in the case where the memory circuit 12 has a function of storing configuration data, the driver circuit 31 is preferred to have a structure with which data can be supplied to the cell array 27 in parallel across the data width of the buffer memory device as illustrated in FIG. 9.

The driver circuit 30 controls the potentials of the wirings RWL to select one group 26 that determines the electrical connection between the plurality of wirings RBL and the plurality of wirings SL, from the groups 26 included in each of the cell arrays 20. Furthermore, the driver circuit 30 controls the potentials of the wirings RWL to select one group 26 from which data is read out, from the groups 26 included in each of the cell arrays 20.

The driver circuit 30 illustrated in FIG. 9 includes, specifically, a circuit 36 which has a function of generating signals for selecting one cell array 20 from the plurality of cell arrays 20, and a plurality of circuits 37 which have a function of selecting one group 26 in the selected cell array 20 according to signals input to wirings MODE-1 to MODE-m. As the circuit 36, a decoder can be used, for example. As the circuits 37, AND circuits can be used, for example.

To select one group 26 from the groups 26, which are included in each of the cell arrays 20 storing data containing the circuit structure, in the driver circuit 30 illustrated in FIG. 9, the potentials of all signals output from the circuit 36 are set to high levels and the potential of only the wiring MODE connected to the group 26 to be selected among the wirings MODE-1 to MODE-m is set to a high level. Note that with the structure illustrated in FIG. 9, whether the potentials of all the signals output from the circuit 36 are set to high levels is determined according to a potential supplied from a wiring ALLEN to the circuit 36.

In the driver circuit 30 illustrated in FIG. 9, when a signal containing data on an address, which is supplied from a wiring RADR, is decoded by the circuit 36, one group 26 from which data is read is selected from the groups 26. When one group 26 is selected, the electrical connection between the plurality of wirings RBL and the plurality of wirings SL can be determined. A predetermined potential such as a ground potential is supplied to the wirings SL while one group 26 is selected by the driver circuit 30, whereby data stored in each of the circuits 21 of the selected group 26 can be output to wirings RBL-1 to RBL-n.

The driver circuit 32 controls the potentials of wirings WWL-1 to WWL-sm to select one group 26 to which data is written, from the groups 26 included in each of the cell arrays 20.

The driver circuit 32 illustrated in FIG. 9 includes, specifically, a circuit 38 which has a function of generating signals for selecting one cell array 20 from the plurality of cell arrays 20, and a plurality of circuits 39 which have a function of selecting one group 26 in the selected cell array 20 according to signals input to the wirings MODE-1 to MODE-m. As the circuit 38, a decoder can be used, for example. As the circuits 39, AND circuits can be used, for example. In addition, to select one cell array 20 to which data is written, in the driver circuit 32 illustrated in FIG. 9, a signal containing data on an address, which is supplied from a wiring WADR, is decoded by the circuit 38.

<Configuration Example of Cell Array>

Next, a specific structural example of a cell array 20 included in the memory circuit 12 will be described.

Figure 10:
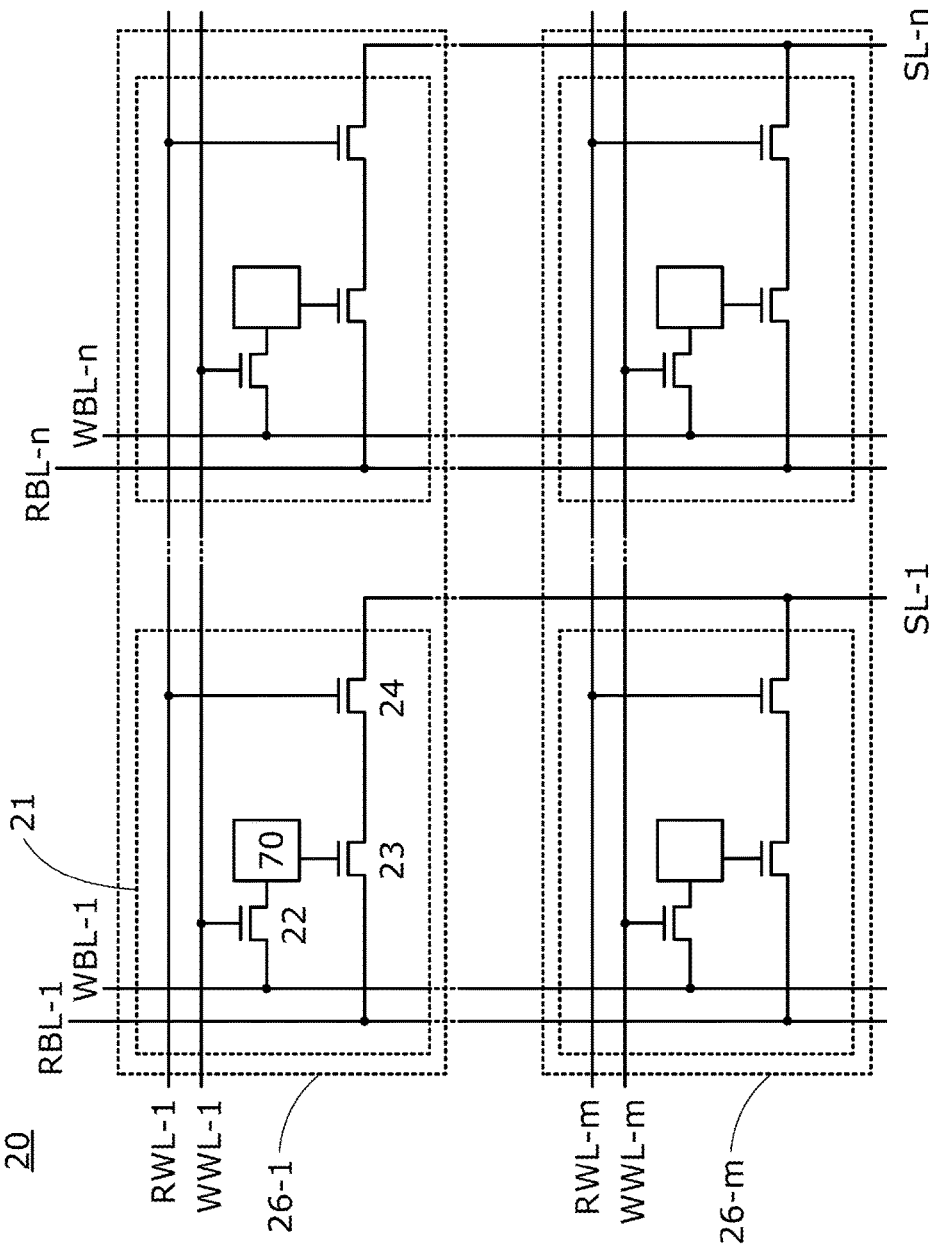
FIG. 10 illustrates a structural example of a cell array.

The cell array 20 illustrated in FIG. 10 includes a plurality of wirings WBL represented as wirings WBL-1 to WBL-n (n is a natural number greater than or equal to 2), a plurality of wirings RBL represented as wirings RBL-1 to RBL-n, a plurality of wirings SL represented as wirings SL-1 to SL-n, a plurality of wirings WWL represented as wirings WWL-1 to WWL-m (m is a natural number greater than or equal to 2), and a plurality of wirings RWL represented as wirings RWL-1 to RWL-m. The cell array 20 illustrated in FIG. 10 also includes (n×m) circuits 21. Each of the circuits 21 at least includes a transistor 22, a transistor 23, a transistor 24, and a memory element 70.

The kinds and number of wirings provided in the cell array 20 can be determined by the structure, number, and position of the circuits 21.

The (n×m) circuits 21 are divided into m groups 26, each of which is connected to a wiring WWL-j and a wiring RWL-j (j is a natural number less than m) and includes n circuits 21. In FIG. 10, the m groups 26 are shown as groups 26-1 to 26-m.

Specifically, in the circuit 21 in the j-th row and the i-th column (i is a natural number less than n), a gate of the transistor 22 is electrically connected to the wiring WWL-j. One of a source and a drain of the transistor 22 is electrically connected to a wiring WBL-i, and the other is electrically connected to a first terminal of the memory element 70. A second terminal of the memory element 70 is electrically connected to a gate of the transistor 23. One of a source and a drain of the transistor 23 is electrically connected to a wiring RBL-i and the other is electrically connected to one of a source and a drain of the transistor 24. The other of the source and the drain of the transistor 24 is electrically connected to a wiring SL-i. A gate of the transistor 24 is electrically connected to the wiring RWL-j.

The memory element 70 is a circuit which has a function of storing data, and can be, for example, a magnetoresistive random access memory (MRAM) including a magnetic tunnel junction element (an MT element). With use of the magnetoresistive random access memory as the memory element 70, data can be stored in the circuit 21 at high speed, resulting in low power consumption. For the memory element 70, a plurality of transistors and a circuit element such as a magnetic tunnel junction element (an MTJ element) are used. The circuit 21 is provided with a wiring having a function of supplying potentials to these circuit elements, and the kinds and number of the wirings can be determined by the structure of the memory element 70.

Note that the circuit 21 is not limited to the structure of FIG. 10, and may be provided with an element such as a switch between the wiring and the transistor, and the arrangement of the switches and the connection relationship of the wirings may be changed. For example, the transistor 24 may be provided between the wiring RBL-i and the transistor 23. In that case, the gate of the transistor 24 is electrically connected to the wiring RWL j. One of a source and a drain of the transistor 24 is electrically connected to the wiring RBL-i, and the other of the source and the drain of the transistor 24 is electrically connected to one of the source and the drain of the transistor 23. Compared to the structure of the circuit 21 in FIG. 10, generation of noise in the wiring SL can be reduced even when the potential of the wiring RWL varies. A malfunction of the circuit 19 electrically connected to the wiring SL can be prevented.

Each of the circuits 21 may also include another circuit element such as a transistor, a diode, a resistor, a capacitor, an inductor, or the like as necessary.

Note that FIG. 10 illustrates the case where the transistors 22 to 24 are n-channel transistors; however, the transistors 22 to 24 and the transistors included in the memory element 70 may each be an n-channel transistor or a p-channel transistor.

In each of the circuits 21 included in the cell array 20 illustrated in FIG. 10, when a signal containing data is supplied to the wiring WBL while the transistor 22 is on, the signal is supplied to the memory element 70 through the transistor 22. When the transistor 22 is turned off, the data of the signal is retained in the memory element 70. Then, the signal containing the data retained in the memory element 70 is supplied to the gate of the transistor 23. Then, the transistor 22 remains off state, whereby the signal supplied to the gate of the transistor 23 is retained. The transistor 23 is turned on or off depending on the potential of the gate which retains the signal.

Since the transistor 24 and the transistor 23 are electrically connected to each other in series, the transistor 24 controls the electrical connection (on or off state) between the wiring RBL and the wiring SL, together with the transistor 23. Specifically, when the transistor 23 and the transistor 24 are on, the wiring RBL and the wiring SL are electrically connected to each other, which allows current to flow therebetween. In the case where at least one of the transistors 23 and 24 is off, the wiring RBL and the wiring SL are electrically isolated from each other. This means that the electrical connection between the plurality of wirings RBL and the plurality of wirings SL is determined depending on the potential of the signal containing data stored in each of the circuits 21.

In the case where the memory circuit 12 functions as a buffer memory device, or in the case where the memory circuit 12 has a function of storing configuration data, a predetermined potential such as a ground potential is supplied to the wiring SL, for example. Then, when the transistor 24 is turned on, whether the potential is supplied to the wiring RBL through the transistor 23 and the transistor 24 is determined, whereby data stored in the circuit 21 can be read. In that case, before the data is read, the potential of the wiring RBL is initialized by supplying a potential different from that of the wiring SL to the wiring RBL.

In the case where the memory circuit 12 has a function of storing configuration data and has a function of a switch for controlling electrical connection between the plurality of circuits 19 according to configuration data, the wiring RBL is connected to one of the plurality of circuits 19 illustrated in FIG. 5, and the wiring SL is connected to another one of the plurality of circuits 19. Accordingly, the electrical connection between the circuits 19 is controlled according to the data stored in each of the circuits 21 in the cell array 20.

In the transistor 22, 23, or 24 the transistor in the memory element 70 in FIG. 10, any of various kinds of materials such as silicon, germanium, silicon germanium, an oxide semiconductor, and the like can be used as a material of a semiconductor film in which a channel formation region is formed.

Figure 11:
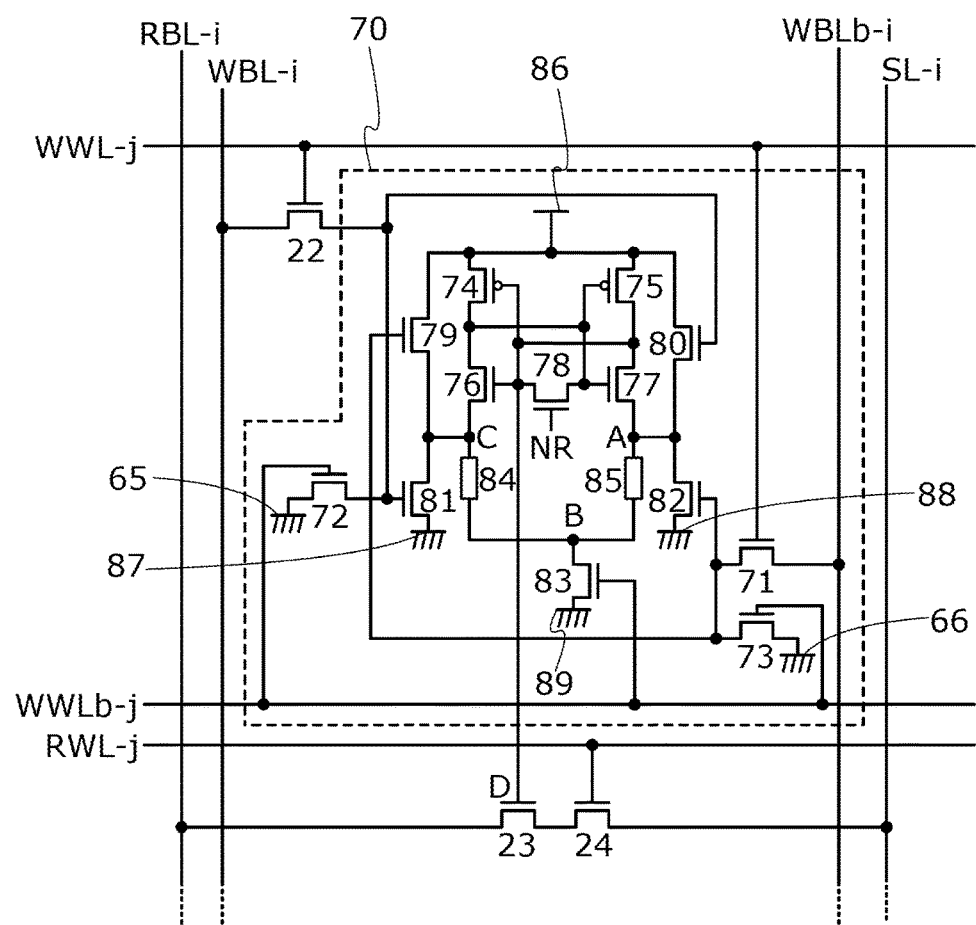
FIG. 11 illustrates a structural example of a circuit 21.

Next, an example of a specific structure of the circuit 21 is illustrated in FIG. 11. FIG. 11 illustrates an example of the structure of the circuit 21 in which a magnetoresistive random access memory including an MTJ element is used as the memory element 70.

The circuit 21 in the j-th row and the i-th column illustrated in FIG. 11 includes the transistors 22 to 24 and the memory element 70. The memory element 70 illustrated in FIG. 11 includes transistors 71 to 83, an MTJ element 84, and an MTJ element 85. FIG. 11 illustrates the case where a wiring WWLb-j and a wiring WBLb-i are provided in the circuit 21 in addition to the wiring WWL-j, the wiring RWL-j, the wiring RBL-i, the wiring WBL-i, and the wiring SL-i. FIG. 11 illustrates the case where the circuit 21 is provided with wirings 86 to 89, wirings 65 and 66, and a wiring NR.

A gate of the transistor 72 is electrically connected to the wiring WWLb-j, and one of a source and a drain of the transistor 72 is electrically connected to a gate of the transistor 81 and a gate of the transistor 80, and the other of the source and the drain is electrically connected to the wiring 65 (here, a low voltage power supply line) to which a predetermined potential is supplied. A gate of the transistor 73 is electrically connected to the wiring WWLb-j, and one of a source and a drain of the transistor 73 is electrically connected to a gate of the transistor 79 and a gate of the transistor 82, and the other of the source and the drain of the transistor 73 is electrically connected to the wiring 66 (here, a low voltage power supply line) to which a predetermined potential is supplied. A gate of the transistor 71 is electrically connected to the wiring WWL-j, and one of a source and a drain of the transistor 71 is electrically connected to the gate of the transistor 79 and the gate of the transistor 82, and the other of the source and the drain of the transistor 71 is electrically connected to the wiring WBLb-i.

The wiring WWLb-j is a wiring to which a signal having the opposite polarity with respect to that of the signal supplied to the wiring WWL-j is supplied, and the wiring WBLb-i is a wiring to which a signal having the opposite polarity with respect to that of a signal supplied to the wiring WBL-i is supplied. Note that as the wiring WWLb-j, a wiring electrically connected to an output terminal of an inverter whose input terminal is electrically connected to the wiring WWL-j can be used. In addition, as the wiring WBLb-i, a wiring electrically connected to an output terminal of an inverter whose input terminal is electrically connected to the wiring WBL-i can be used.

A gate of the transistor 74 is electrically connected to a gate of the transistor 76, and one of a source and a drain of the transistor 74 is electrically connected to the wiring 86 (here, a high voltage power supply line) to which a predetermined potential is supplied, and the other of the source and the drain of the transistor 74 is electrically connected to a gate of the transistor 75 and a gate of the transistor 77. The gate of the transistor 74 and the gate of the transistor 76 are electrically connected to the gate of the transistor 23. That is, the gate of the transistor 74 and the gate of the transistor 76 correspond to the second terminal of the memory element 70. The gate of the transistor 75 is electrically connected to the gate of the transistor 77, and one of a source and a drain of the transistor 75 is electrically connected to the wiring 86, and the other of the source and the drain of the transistor 75 is electrically connected to the gate of the transistor 74 and the gate of the transistor 76. One of a source and a drain of the transistor 76 is electrically connected to the gate of the transistor 75 and the gate of the transistor 77, and the other of the source and the drain of the transistor 76 is electrically connected to a first ferromagnetic layer of the MTJ element 84. One of a source and a drain of the transistor 77 is electrically connected to the gate of the transistor 74 and the gate of the transistor 76, and the other of the source and the drain of the transistor 77 is electrically connected to a first ferromagnetic layer of the MTJ element 85.

A gate of the transistor 78 is electrically connected to the wiring NR, and one of a source and a drain of the transistor 78 is electrically connected to the gate of the transistor 74 and the gate of the transistor 76, and the other of the source and the drain of the transistor 78 is electrically connected to the gate of the transistor 75 and the gate of the transistor 77. One of a source and a drain of the transistor 79 is electrically connected to the first ferromagnetic layer of the MTJ element 84, and the other of the source and the drain of the transistor 79 is electrically connected to the wiring 86.

The gate of the transistor 80 and the gate of the transistor 81 are electrically connected to the other of the source and the drain of the transistor 22. That is, the gate of the transistor 80 and the gate of the transistor 81 correspond to the first terminal of the memory element 70. One of a source and a drain of the transistor 80 is electrically connected to the first ferromagnetic layer of the MTJ element 85, and the other of the source and the drain of the transistor 80 is electrically connected to the wiring 86. One of a source and a drain of the transistor 81 is electrically connected to the first ferromagnetic layer of the MTJ element 84, and the other of the source and the drain of the transistor 81 is electrically connected to the wiring 87 (here, a low voltage power supply line, especially a ground line) to which a predetermined potential is supplied. One of a source and a drain of the transistor 82 is electrically connected to the first ferromagnetic layer of the MTJ element 85, and the other of the source and the drain of the transistor 82 is electrically connected to the wiring 88 (here, a low voltage power supply line, especially a ground line) to which a predetermined potential is supplied. A gate of the transistor 83 is electrically connected to the wiring WWLb-j, and one of a source and a drain of the transistor 83 is electrically connected to a second ferromagnetic layer of the MTJ element 84 and a second ferromagnetic layer of the MTJ element 85, and the other of the source and the drain of the transistor 83 is electrically connected to the wiring 89 (here, a low voltage power supply line, especially a ground line).

An MTJ element used as the MTJ element 84 or the MTJ element 85 has a structure in which an insulating layer is provided between the first ferromagnetic layer and the second ferromagnetic layer, and magnetization directions of the pair of ferromagnetic layers change depending on the direction of current flowing in the MTJ element. Thus, the direction of current flowing in the MTJ element is controlled, thereby controlling whether the magnetization directions of the pair of ferromagnetic layers are parallel or anti-parallel to each other (hereinafter also referred to as the magnetization directions of the MTJ element are parallel or anti-parallel). Here, the resistance value of the MTJ element in the case where the magnetization directions of the MTJ element are parallel is smaller than that in the case where the magnetization directions of the MTJ element are anti-parallel. For example, the case where the magnetization directions of the MTJ element are parallel is made to correspond to a logical value of "1", and the case where the magnetization directions of the MTJ element are anti-parallel is made to correspond to a logical value of "0", whereby the MTJ element can be used as a memory element.

In FIG. 11, the first ferromagnetic layer of the MTJ element 85 is node A, and the second ferromagnetic layer of the MTJ element 85 and the second ferromagnetic layer of the MTJ element 84 are node B, and the first ferromagnetic layer of the MTJ element 84 is node C. In that case, the magnetization directions of the MTJ element 84 are parallel and the magnetization directions of the MTJ element 85 are anti-parallel when current flows from the node A to the node C through the node B. When current flows from the node C to the node A through the node B, the magnetization directions of the MTJ element 84 are anti-parallel, and the magnetization directions of the MTJ element 85 are parallel.

<Operation Example of Memory Circuit>

Next, an example of the operation of the memory circuit 12 in which the semiconductor device 10 illustrated in FIG. 5 includes the memory circuit 12 illustrated in FIGS. 9 to 11 will be described with reference to a timing chart in FIG. 12.

Note that the gate of the transistor 23 is illustrated as a node D in FIG. 11. The timing chart in FIG. 12 illustrates a potential of the node D(1, 1) of the circuit 21 in the first row and the first column, and a potential of the node D(1, n) of the circuit 21 in the first row and the n-th column, a potential of the node D(m, 1) of the circuit 21 in the m-th row and the first column, and a potential of the node D(m, n) of the circuit 21 in the m-th row and the n-th column.

Figure 12:
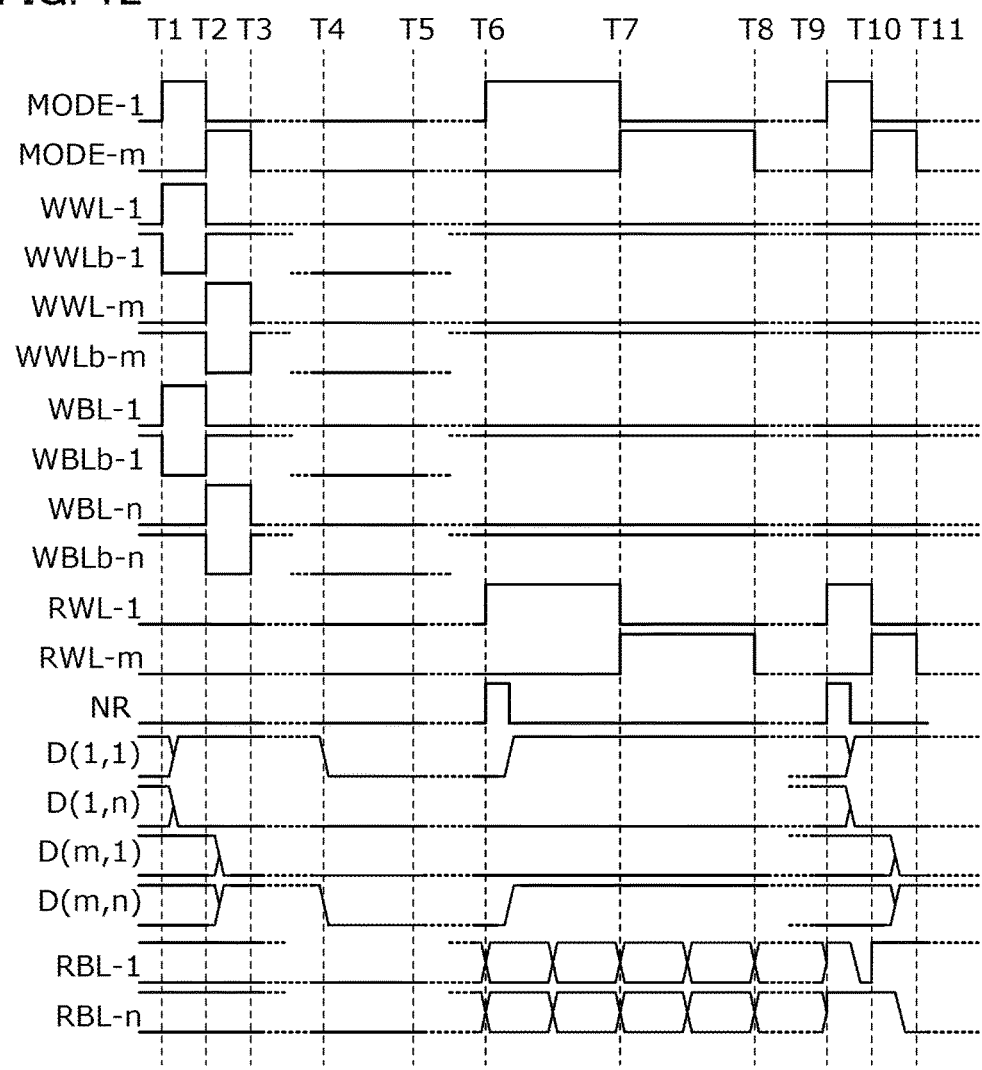
FIG. 12 is a timing chart.

In the timing chart in FIG. 12, a period from time T1 to time T3 corresponds to a period for storing data in the cell array 27. Specifically, in the case where the memory circuit 12 has a function of storing a start-up routine, the above period corresponds to a period for storing data corresponding to the start-up routine in the cell array 27 before stopping the supply of power to the semiconductor device 10. Alternatively, in the case where the memory circuit 12 functions as a buffer memory device, the above period specifically corresponds to a period for storing data in the cell array 27. Alternatively, in the case where the memory circuit 12 has both a function of storing configuration data and a function of a switch for controlling the electrical connection between the plurality of circuits 19 according to the configuration data, the above period specifically corresponds to a period for storing the configuration data.

First, in a period from time T1 to time T2, the signal containing data on an address (hereinafter referred to as an address signal), which is supplied to the wiring WADR, is decoded by the circuit 38. Thus, a high-level potential is supplied from the circuit 38 to the circuits 39 corresponding to the wirings WWL-1 to WWL-m among the plurality of circuits 39. In addition, in the period from time T1 to time T2, a high-level potential is supplied to the wiring MODE-1 among the wirings MODE-1 to MODE-m, and a low-level potential is supplied to all the wirings MODE except the wiring MODE-1. By the above operation, a high-level potential and a low-level potential are supplied to the wiring WWL-1 and the wiring WWLb-1, respectively. As a result, the group 26 corresponding to the wiring WWL-1 is selected. A high-level potential is supplied to the wiring WBL-1, a low-level potential is supplied to a wiring WBLb-1, the low-level potential is supplied to the wiring WBL-n, and the high-level potential is supplied to a wiring WBLb-n, whereby in the above group 26, data "1" is written to the circuit 21 in the first row and the first column, and data "0" is written to the circuit 21 in the first row and the n-th column. A specific operation of the memory element 70 in which data is written to the circuit 21 is described below.

The high-level potential is supplied to the wiring WWL-1 of the circuit 21 in the first row and the first column, so that the transistor 22 and the transistor 71 are turned on. The low-level potential is supplied to the wiring WWLb-1, so that the transistor 83 are turned off. Then, the high-level potential is supplied from the wiring WBL-1 to the gates of the transistors 80 and 81 through the transistor 22, so that the transistors 80 and 81 are turned on. Furthermore, the low-level potential is supplied from the wiring WBLb-1 to the gates of the transistors 79 and 82 through the transistor 71, so that the transistors 79 and 82 are turned off. In such a manner, current flows from the wiring 86 to the wiring 87 through the transistor 80, the MTJ element 85, the MTJ element 84, and the transistor 81 in this order.

Here, the MTJ element 84 is supplied with current that flows from the node B to node C, so that magnetization directions of the MTJ element 84 are parallel. The MTJ element 85 is supplied with the current that flows from the node A to the node B, so that the magnetization directions of MTJ element 85 are anti-parallel. Thus, the resistance value of the MTJ element 84 is lower than that of the MTJ element 85. By the above operation, the logical value of "1" is stored in the circuit 21 in the first row and the first column.

In the circuit 21 in the first row and the first column, current flows from the wiring 86 to the wiring 87 through the transistor 80, the MTJ element 85, the MTJ element 84, and the transistor 81 in this order. Thus, the potential of the node C becomes lower than the potential of the node A.

Here, since the gate of the transistor 78 is supplied with a low-level potential from the wiring NR, the transistor 78 is turned off, so that the gates of the transistors 74 and 76 are electrically isolated from the gates of the transistors 75 and 77. Furthermore, potentials of the gates of the transistors 74, 75, 76, and 77 are indeterminate. Therefore, in the circuit 21 in the first row and the first column, the potential of the node C is lower than the potential of the node A, whereby the potentials of the gates of the transistors 75 and 77 are lower than the potentials of the gates of the transistors 74 and 76 due to a slight amount of current flowing through the transistors 76 and 77. As a result, the transistors 75 and 76 are closer to on state, and the transistors 74 and 77 are closer to off state. Next, a potential which is almost low level is supplied to the gate of the transistor 75 from the wiring 87 through the transistor 76 which is closer to on state, whereby the transistor 75 is much closer to on state. Then, a high-level potential is supplied from the wiring 86 to the node D (1, 1) through the transistor 75.

A high-level potential is supplied to the wiring WWL-1 in the circuit 21 in the first row and the n-th column, so that the transistors 22 and 17 are turned on. The low-level potential is supplied to the wiring WWLb-1, so that the transistor 83 are turned off. A low-level potential is supplied from the wiring WBL-n to the gates of the transistors 80 and 81 through the transistor 22, so that the transistors 80 and 81 are turned off. In addition, the high-level potential is supplied from a wiring WBLb-n to the gates of the transistors 79 and 82 through a transistor 71, so that the transistors 79 and 82 are turned on. Therefore, current flows from the wiring 86 to the wiring 88 through the transistor 79, the MTJ element 84, the MTJ element 85, and the transistor 82 in this order.

Here, The MTJ element 84 is supplied with the current which flows from the node C to node B, whereby the magnetization directions of MTJ element 84 are antiparallel. The MTJ element 85 is supplied with the current which flows from the node B to node A, whereby the magnetization directions of MTJ element 85 are parallel. Thus, the resistance value of the MTJ element 84 can be higher than that of the MTJ element 85. Accordingly, data "0" is stored in the circuit 21 in the first row and the n-th column.

In the circuit 21 in the first row and the n-th column, current flows from the wiring 86 to the wiring 88 through the transistor 79, the MTJ element 84, the MTJ element 85, and the transistor 82 in this order. Thus, the potential of node C becomes higher than the potential of node A.

Here, since a gate of the transistor 78 is provided with the low-level potential from the wiring NR, the transistor 78 is off, so that the gates of the transistors 74 and 76 are electrically isolated from the gates of the transistors 75 and 77. Furthermore, potentials of the gates of the transistors 74, 75, 76 and 77 are floating. Therefore, in a circuit 21 in the first row and the n-th column, the potential of node C is higher than the potential of node A. The potentials of the gates of the transistors 75 and 77 are lower than those of the gates of the transistors 74 and 76 because a slight amount of current flows into the transistors 76 and 77. As a result, the transistors 75 and 76 are closer to off state, and the transistors 74 and 77 are closer to on state. Next, a potential which is almost high level is supplied from a wiring 86 to the gate of the transistor 77 through the transistor 74 which is closer to on state, whereby the transistor 77 is much closer to on state. Then, a low-level potential is supplied from the wiring 88 through the transistor 77 to the node D(1,n).

Next, in a period from time T2 to time T3, the address signal, which is supplied to the wiring WADR, is decoded by the circuit 38. Thus, the high-level potential is supplied from the circuit 38 to the circuits 39 corresponding to the wirings WWL-1 to WWL-m among the plurality of circuits 39. In addition, in the period from time T2 to time T3, the high-level potential is supplied to the wiring MODE-m among the wirings MODE-1 to MODE-m, and the low-level potential is supplied to all the wirings MODE except the wiring MODE-m. By the above operation, the high-level potential is supplied to the wiring WWL-m, and the low-level potential is supplied to the wiring WWLb-m, whereby the group 26 corresponding to the wiring WWL-m is selected. The low-level potential is supplied to the wiring WBL-1, and the high-level potential is supplied to the wiring WBLb-1, the high-level potential is supplied to the wiring WBL-n, and the low-level potential is supplied to the wiring WBLb-n, whereby in the above group 26, data "0" is written to the circuit 21 in the m-th row and the first column, and data "1" is written to the circuit 21 in the m-th row and the n-th column. Note that the operations of the circuit 21 in the first row and the first column and the circuit 21 in the first row and the n-th column can be referred to for the specific operation of the memory element 70 when data is written to the circuit 21.

In the timing chart in FIG. 12, a period from the time T4 to the time T5 corresponds to a period during which power supply to the semiconductor device 10 is stopped. In the above period, all the potentials that are supplied to each wiring are low. In addition, all the potentials of the node D (1, 1) of the circuit 21 in the first row and the first column, the node D (1, n) of the circuit 21 in the first row and the n-th column, the node D (m, 1) of the circuit 21 in the m-th row and the first column, and the node D (m, n) of the circuit 21 in the m-th row and the n-th column are low.

In the timing chart in FIG. 12, in the case where the memory circuit 12 has a function of a switch for controlling the electrical connection between the plurality of circuits 19 after the supply of power to the semiconductor device 10 is resumed, a period from time T6 to time T8 corresponds to a period where the plurality of circuits 19 operate according to configuration data. Note that the case where output signals from the memory circuit 12 are supplied to the wirings RBL-1 to RBL-n and the potentials of the wirings SL-1 to SL-n are supplied as input signals to the circuits 19 is described below as one example.

First, in a period from time T6 to time T7, the high-level potential is supplied from the circuit 36 to all the circuits 37. The high-level potential is supplied to the wiring MODE-1 among the wirings MODE-1 to MODE-m, and the low-level potential is supplied to all the wirings MODE except the wiring MODE-1. By the above operation, the high-level potential is supplied to the wirings RWL whose potentials are controlled by the circuits 37 corresponding to the wiring MODE-1. Thus, the groups 26 corresponding to the wirings RWL-1, RWL-(m+1), RWL-(s−1)m+1, and the like are selected, and the plurality of circuits 19 operate according to the configuration data stored in the circuits 21 in these groups 26. The specific operation of the memory element 70 in the case where the electrical connection of the circuit 21 is determined in accordance with the stored data is described below.

First, in the memory element 70, the high-level potential is supplied from the wirings WWLb-1 and WWLb-m to the gates of the transistors 72 and 73, so that the transistors 72 and 73 are turned on in the circuit 21 in the first row and the first column, the circuit 21 in the first row and the n-th column, the circuit 21 in the m-th row and the first column, and the circuit 21 in the m-th row and the n-th column. Next, the low-level potential is supplied from the wiring 65 to the gates of the transistors 80 and 81 through the transistor 72 and the low-level potential is supplied from the wiring 66 to the gates of the transistors 79 and 82 through the transistor 73. Accordingly, the transistors 79 to 82 are turned off. In addition, a high-level potential is supplied from the wiring WWLb-1 to the gate of the transistor 83, whereby the transistor 83 is turned on.

After that, when the high-level potential is supplied from the wiring NR to the gate of the transistor 78, the transistor 78 is turned on. Thus, the gates of the transistors 74 to 77 are electrically connected to each other. At this time, there are some cases where a current flows from the wiring 86 to the wiring 89 through the transistor 74, the transistor 76, the MTJ element 84, and the transistor 83 in this order, and where a current flows from the wiring 86 to the wiring 89 through the transistor 75, the transistor 77, the MTJ element 85, and the transistor 83 in this order are generated.

In the circuit 21 in the first row and the first column, the magnetization directions of the MTJ element 84 are parallel, and those of the MTJ element 85 are anti-parallel, so that the resistance value of the MTJ element 84 is lower than that of the MTJ element 85. Therefore, in the circuit 21 in the first row and the first column, the potential of the node C is lower than the potential of the node A.

In a circuit 21 in the first row and the n-th column, the magnetization directions of the MTJ element 84 are anti-parallel, and those of the MTJ element 85 are parallel, so that the resistance value of the MTJ element 84 is higher than that of the MTJ element 85. Therefore, in the circuit 21 in the first row and the n-th column, the potential of the node C is higher than the potential of node A.

In a circuit 21 in the m-th row and the first column, the magnetization directions of the MTJ element 84 are anti-parallel, and those of the MTJ element 85 are parallel, so that the resistance value of the MTJ element 84 is higher than that of the MTJ element 85. Therefore, in the circuit 21 in the m-th row and the first column, the potential of the node C is higher than the potential of node A.

In a circuit 21 in the m-th row and the n-th column, the magnetization directions of the MTJ element 84 are parallel, and those of the MTJ element 85 are anti-parallel, so that the resistance value of the MTJ element 84 is lower than that of the MTJ element 85. Therefore, in the circuit 21 in the m-th row and the n-th column, the potential of the node C is lower than the potential of node A.

After that, since the gate of the transistor 78 is supplied with the low-level potential from the wiring NR, the transistor 78 is off, so that the gates of the transistors 74 and 76 are electrically isolated from the gates of the transistors 75 and 77.

Here, in a circuit 21 in the first row and the first column, the potential of node C is lower than that of node A. The potentials of the gates of the transistors 75 and 77 are lower than those of the gates of the transistors 74 and 76 because a slight amount of current flows into the transistors 76 and 77. As a result, the transistors 75 and 76 are closer to on state, and the transistors 74 and 77 are closer to off state. Next, a potential which is almost low level is supplied from a wiring 87 to the gate of the transistor 75 through the transistor 76 which is closer to on state, whereby the transistor 75 is much closer to on state. Then, a high-level potential is supplied from the wiring 86 to the node D(1,1) through the transistor 75.

At this time, in the circuit 21 in the first row and the n-th column, the potential of node C is higher than the potential of node A. The potentials of the gates of the transistors 75 and 77 are higher than the potentials of the gates of the transistors 74 and 76 because a slight amount of current flows into the transistors 76 and 77. As a result, the transistors 75 and 76 are closer to off state, and the transistors 74 and 77 are closer to on state. Next, a potential which is almost high level is supplied from a wiring 86 to the gate of the transistor 77 through the transistor 74 which is closer to on state, whereby the transistor 77 is much closer to on state. Then, a low-level potential is supplied from the wiring 89 to the node D(1, n) through a transistor 83, the MTJ element 85, and the transistor 77.

In addition, in the circuit 21 in the m-th row and the first column, the potential of node C is higher than the potential of node A. The potentials of the gates of the transistors 75 and 77 are higher than the potentials of the gates of the transistors 74 and 76 because a slight amount of current flows into the transistors 76 and 77. As a result, the transistors 75 and 76 are closer to off state, and the transistors 74 and 77 are closer to on state. Next, a potential which is almost high level is supplied from a wiring 86 to the gate of the transistor 77 through the transistor 74 which is closer to on state, whereby the transistor 77 is much closer to on state. Then, a low-level potential is supplied from the wiring 89 to the node D(m, 1) through a transistor 83, the MTJ element 85, and the transistor 77.

In addition, in the circuit 21 in the m-th row and the n-th column, the potential of node C is lower than that of node A. The potentials of the gates of the transistors 75 and 77 are lower than those of the gates of the transistors 74 and 76 because a slight amount of current flows into the transistors 76 and 77. As a result, the transistors 75 and 76 are closer to on state, and the transistors 74 and 77 are closer to off state. Next, a potential which is almost low level is supplied from a wiring 87 to the gate of the transistor 75 through the transistor 76 which is closer to on state, whereby the transistor 75 is much closer to on state. Then, a high-level potential is supplied from the wiring 86 to the node D(m, n) through the transistor 75.

Then, in the period from the time T6 to the time T7, a high-level potential is supplied from the wiring RWL-1 to the circuit 21 in the first row and the first column and the gate of the transistor 24 in the circuit 21 in the first row and the n-th column, whereby the transistor 24 is turned on. In the circuit 21 in the first row and the first column, a high-level potential is supplied to the node D(1, 1), so that the transistor 23 is turned on. Accordingly, the circuit 21 in the first row and the first column is brought into a conductive-state. In addition, in the circuit 21 in the first row and the n-th column, a low-level potential is supplied to the node D(1, n), so that the transistor 23 is turned off. Accordingly, the circuit 21 in the first row and the n-th column is brought into a non-conductive state.

Next, in a period from time T7 to time T8, the high-level potential is supplied from the circuit 36 to all the circuits 37. The high-level potential is supplied to the wiring MODE-m among the wirings MODE-1 to MODE-m, and the low-level potential is supplied to all the wirings MODE except the wiring MODE-m. By the above operation, the high-level potential is supplied to the wirings RWL whose potentials are controlled by the circuits 37 corresponding to the wiring MODE-m. Thus, the groups 26 corresponding to the wirings RWL-m, RWL-2m, RWL-sm, and the like are selected, and the plurality of circuits 19 operate according to the configuration data stored in the circuits 21 in these groups 26.

Specifically, in the period from the time T7 to the time T8, the potential of the node D (m, 1) of the circuit 21 in the m-th row and the first column is at the low level, and the potential of the node D (m, n) in the circuit 21 in the m-th row and the n-th column is at the high level, whereby the circuit 21 in the m-th row and the first column is brought into a non-conduction state and the circuit 21 in the m-th row and the n-th column is brought into a conduction state.

Next, in the case where the memory circuit 12 has a function of storing a start-up routine after the supply of power to the semiconductor device 10 is resumed, a period from time T9 to time T11 corresponds to a period for reading data stored in the cell array 27. In the case where the memory circuit 12 functions as a buffer memory device, the period from time T9 to time T11 corresponds to a period for reading data stored in the cell array 27. Note that in either case, after time T3, the above-described operation in the period from time T6 to time T8 is not performed and the operation in the period from time T9 to time T11 is performed. In addition, in either case, in the period from time T9 to time T11, the low-level potential is supplied to the wirings SL-1 to SL-n.

First, in a period from time T9 to time T10, the potentials of the wirings RBL-1 to RBL-n are initialized by supplying a potential different from the potential supplied to the wirings SL-1 to SL-n, such as a high-level potential, to the wirings RBL-1 to RBL-n. Furthermore, the address signal supplied to the wiring RADR is decoded by the circuit 36. Thus, the high-level potential is supplied from the circuit 36 to the circuits 37 corresponding to the wirings RWL-1 to RWL-m among the plurality of circuits 37. In addition, in the period from time T9 to time T10, the high-level potential is supplied to the wiring MODE-1 among the wirings MODE-1 to MODE-m, and the low-level potential is supplied to all the wirings MODE except the wiring MODE-1. By the above operation, the high-level potential is supplied to the wiring RWL-1, whereby the group 26 corresponding to the wiring RWL-1 is selected. Since the data "1" and the data "0" are written respectively to the circuit 21 in the first row and the first column and the circuit 21 in the first row and the n-th column in the period from time T1 to time T2, when the group 26 corresponding to the wiring RWL-1 is selected, the low-level potential is supplied to the wiring RBL-1 from the wiring SL-1, and the high-level potential is maintained at the wiring RBL-n. That is, the potentials of the wirings RBL-1 and RBL-n depend on the data stored in the circuits 21; thus, data stored in the circuits 21 in the group 26 corresponding to the wiring RWL-1 can be determined from the potentials of the wirings RBL-1 and RBL-n.

The operation of the memory element 70 in the case where the conduction state of the circuit 21 is determined in accordance with the stored data in the period from the time T6 to the time T8 can be referred to for the specific operation of the memory element 70 at the time of reading the stored data.

Next, in a period from time T10 to time T11, the potentials of the wirings RBL-1 to RBL-n are initialized by supplying a potential different from the potential supplied to the wirings SL-1 to SL-n, such as a high-level potential, to the wirings RBL-1 to RBL-n. Furthermore, the address signal supplied to the wiring RADR is decoded by the circuit 36. Thus, the high-level potential is supplied from the circuit 36 to the circuits 37 corresponding to the wirings RWL-1 to RWL-m among the plurality of circuits 37. In addition, in the period from time T9 to time T10, the high-level potential is supplied to the wiring MODE-m among the wirings MODE-1 to MODE-m, and the low-level potential is supplied to all the wirings MODE except the wiring MODE-m. By the above operation, the high-level potential is supplied to the wiring RWL-m, whereby the group 26 corresponding to the wiring RWL-m is selected. Then, in the period from the time T2 to the time T3, data "0" is written to the circuit 21 in the m-th row and the first column and data "1" is written to the circuit 21 in the m-th row and the n-th column. Therefore, when the group 26 corresponding to the wiring RWL-m is selected, a high-level potential is held in the wiring RBL-1, and a low-level potential is supplied from the wiring SL-1 to the wiring RBL-n. That is, the potentials of the wirings RBL-1 and RBL-n depend on the data stored in the circuits 21; thus, data stored in the circuits 21 in the group 26 corresponding to the wiring RWL-m can be determined from the potentials of the wirings RBL-1 and RBL-n.

Note that data having the same logical value may be stored in a plurality of circuits 21 in different rows and the same column, such as the circuit 21 in the first row and the first column and the circuit 21 in the m-th row and the first column, and data stored in these plurality of circuits 21 may be read at the same time. In that case, at the time of reading data "1" stored in the plurality of circuits 21, the potential of the wiring RBL can be changed more quickly from a high level to a low level, which enables reading data "1" at high speed.

<Structural Example of Circuit 19>

Figure 13:
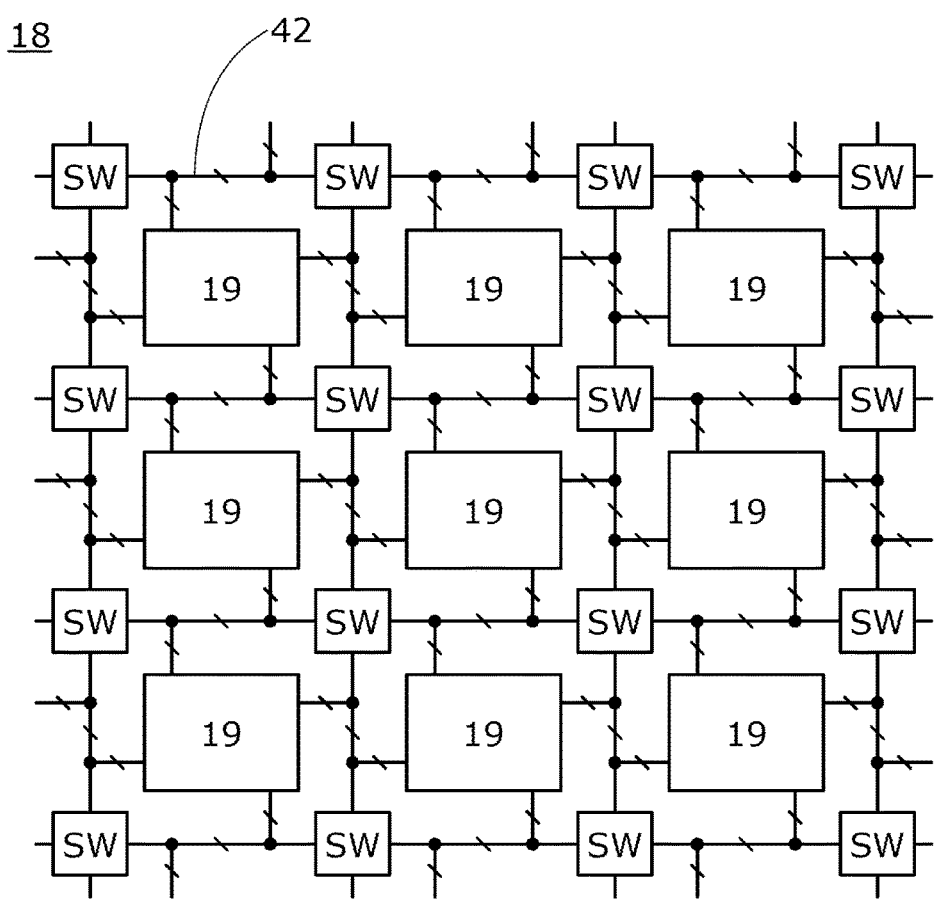
FIG. 13 illustrates a partial structure of a logic circuit.

Next, an example of a structure of the logic circuit 18 in FIG. 5 is illustrated in FIG. 13. Input or output terminals of the plurality of circuits 19 in the logic circuit 18 are electrically connected to a plurality of wirings 42. The plurality of wirings 42 in the logic circuit 18 are electrically connected to switches SW having a function of controlling electrical connection between the wirings 42. The electrical connection between the circuits 19 is controlled with the plurality of wirings 42 and the switches SW.

Note that the plurality of circuits 19 may be electrically connected to wirings having a function of supplying a signal CLK or a signal RES to the circuits 19, in addition to the plurality of wirings 42. The signal CLK can be used to control the timing of signal output from a flip-flop of the circuit 19, for example. The signal RES can be used to control the timing of initialization of data stored in the flip-flop of the circuit 19, for example.

Figure 14A:
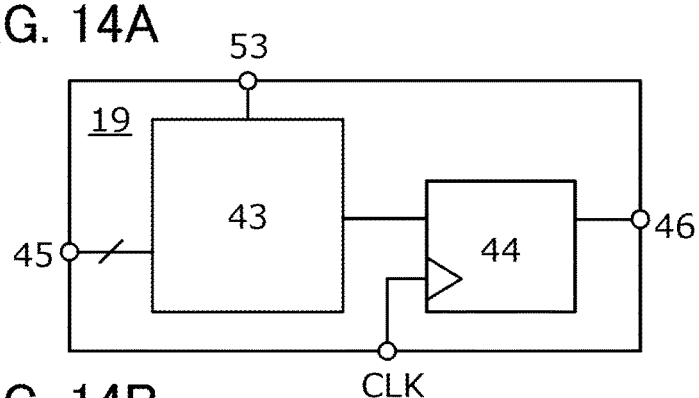
FIGS. 14A to 14D each illustrate a specific circuit structure.

FIG. 14A illustrates one embodiment of the circuit 19. The circuit 19 in FIG. 14A includes a look-up table (LUT) 43 and a flip-flop 44. In the circuit 19 in FIG. 14A, configuration data stored in the memory circuit 12 is supplied to the LUT 43 through a terminal 53. In the LUT 43, the logical value of an output signal with respect to the logical value of an input signal that is input to an input terminal 45 is determined according to configuration data. The flip-flop 44 retains data contained in the output signal of the LUT 43 and outputs an output signal corresponding to the data in synchronization with a signal CLK from an output terminal 46.

The type of the flip-flop 44 may be determined by the configuration data. Specifically, the flip-flop 44 may have a function of any of a D flip-flop, a T flip-flop, a JK flip-flop, and an RS flip-flop according to the configuration data.

Figure 14B:
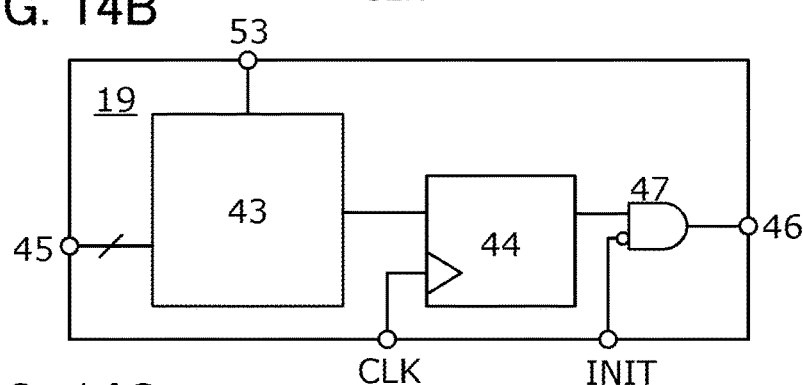

FIG. 14B illustrates another embodiment of the circuit 19. The circuit 19 illustrated in FIG. 14B includes an AND circuit 47 in addition to the components of the circuit 19 in FIG. 14A. To the AND circuit 47, a signal from the flip-flop 44 is supplied as an active high input, and the potential of a signal NIT is supplied as an active low input. With the above structure, the potential of the output terminal 46 can be initialized depending on the potential of the signal NIT.

Figure 14C:
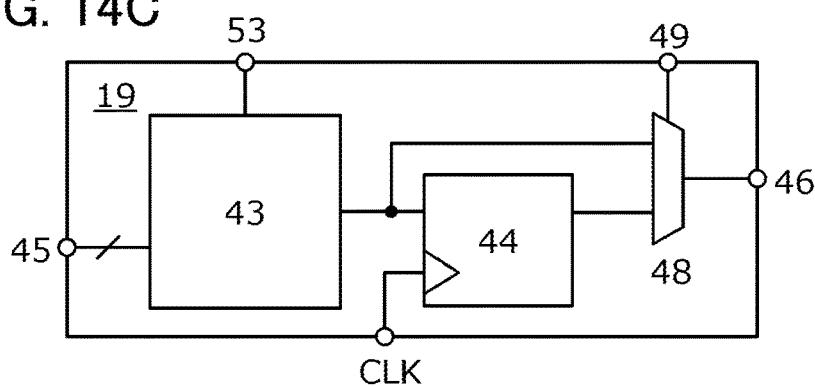

FIG. 14C illustrates another embodiment of the circuit 19. The circuit 19 in FIG. 14C includes a multiplexer 48 in addition to the components of the circuit 19 in FIG. 14A. In the circuit 19 in FIG. 14C, configuration data stored in the memory circuit 12 is supplied to the multiplexer 48 through a terminal 49.

In the LUT 43, the logical value of an output signal with respect to the logical value of an input signal is determined according to configuration data. A signal output from the LUT 43 and a signal output from the flip-flop 44 are input to the multiplexer 48. The multiplexer 48 has functions of selecting and outputting one of the two output signals in accordance with configuration data. The signal output from the multiplexer 48 is output from the output terminal 46.

Figure 14D:
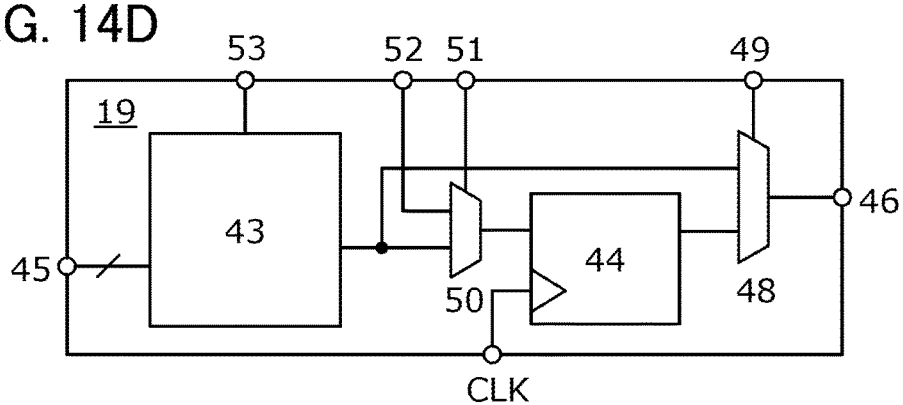

FIG. 14D illustrates another embodiment of the circuit 19. The circuit 19 in FIG. 14D includes a multiplexer 50 in addition to the components of the circuit 19 in FIG. 14C. In the circuit 19 in FIG. 14D, configuration data stored in the memory circuit 12 is supplied to the multiplexer 50 through a terminal 51.

A signal output from the LUT 43 and a signal output from the flip-flop 44 of another circuit 19 and input through a terminal 52 are input to the multiplexer 50. The multiplexer 50 has functions of selecting and outputting one of the two output signals in accordance with configuration data.

<Example of Cross-Sectional Structure of Semiconductor Device>

Figure 15:
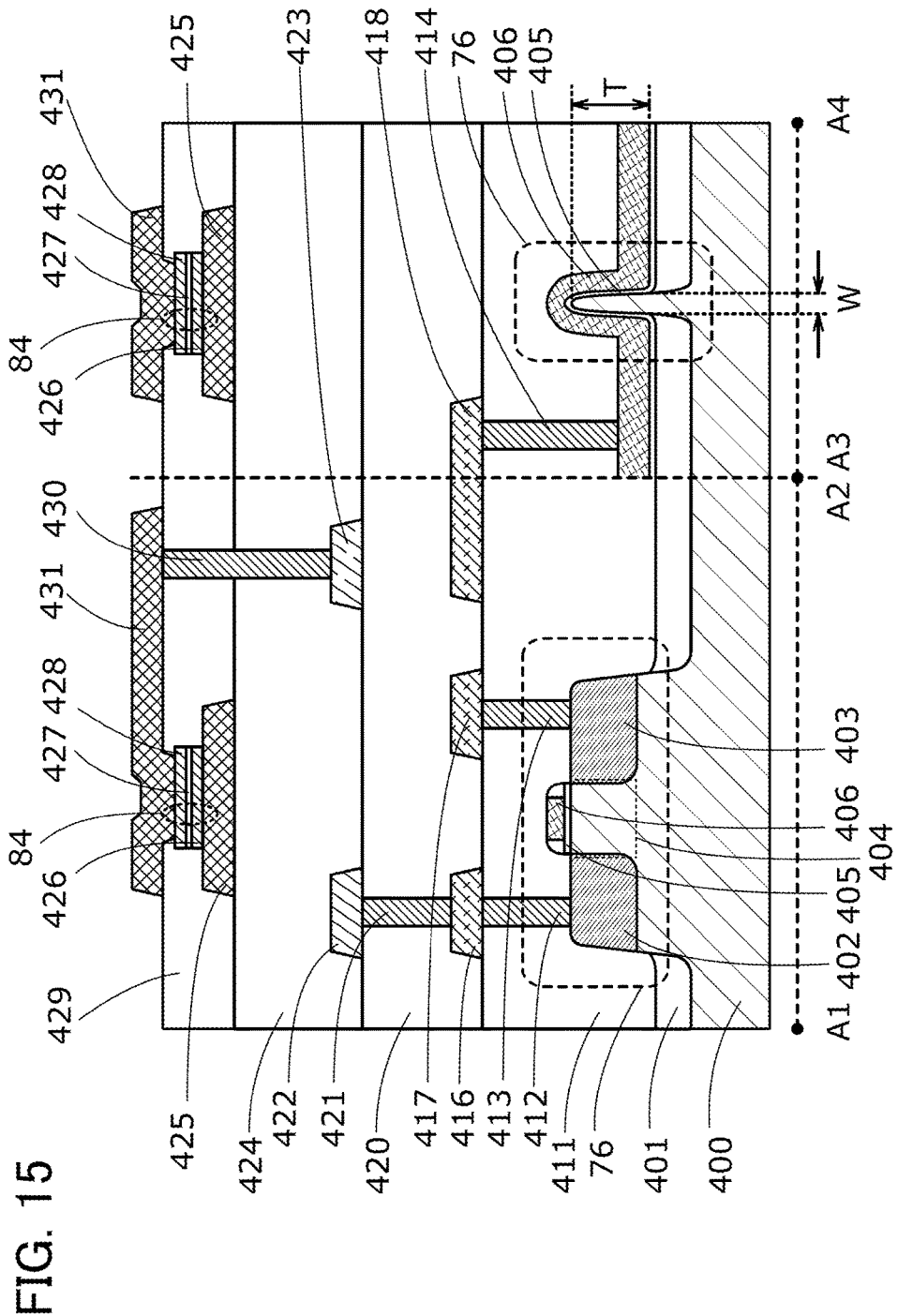
FIG. 15 illustrates a cross-sectional structure of a semiconductor device.

FIG. 15 illustrates an example of a cross-sectional structure of a semiconductor device including the circuit 21 in FIG. 11. A region along dashed-dotted line A1-A2 shows a structure of the MTJ element 84 and the transistor 76 in the channel length direction of the transistor 76, and a region along dashed-dotted line A3-A4 shows a structure of the MTJ element 84 and the transistor 76 in the channel width direction of the transistor 76.

The channel length direction refers to a direction in which a carrier moves between a pair of impurity regions functioning as a source region and a drain region by the most direct way, and the channel width direction refers to a direction perpendicular to the channel length direction in a plane parallel to a substrate.

In FIG. 15, the MTJ element 84 is formed over the transistor 76 including a channel formation region in a single crystal silicon substrate.

The transistor 76 may include the channel formation region in a semiconductor film or a semiconductor substrate of silicon, germanium, or the like in an amorphous, microcrystalline, polycrystalline, or single crystal state. Alternatively, the transistor 76 may include the channel formation region in an oxide semiconductor film or an oxide semiconductor substrate.

In the case where the transistor 76 is formed using a thin silicon film, any of the following can be used in the thin film: amorphous silicon formed by a sputtering method or a vapor phase growth method such as a plasma-enhanced CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 76 is formed can be, for example, a silicon substrate, a germanium substrate, or a silicon germanium substrate. In FIG. 15, a single crystal silicon substrate is used as the substrate 400.

The transistor 76 is electrically isolated by an element isolation method. As the element isolation method, a trench isolation method (a shallow trench isolation (STI) method) or the like can be used. FIG. 15 illustrates an example where the trench isolation method is used to electrically isolate the transistor 76. Specifically, in FIG. 15, the transistor 76 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 76 and a channel formation region 404 placed between the impurity regions 402 and 403 are provided. Further, the transistor 76 includes an insulating film 405 covering the channel formation region 404 and a gate electrode 406 that overlaps with the channel formation region 404 with the insulating film 405 provided therebetween.

In the transistor 76, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 76 can be reduced, and the number of transferred carriers in the transistor 76 can be increased. As a result, the on-state current and field-effect mobility of the transistor 76 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 76 can be further increased and the field-effect mobility of the transistor 76 can be further increased.

Note that when the transistor 76 is formed using a bulk semiconductor substrate, the aspect ratio is preferably 0.5 or more, further preferably 1 or more.

An insulating film 411 is provided over the transistor 76. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An opening is formed in the insulating film 420. A conductive film 421 electrically connected to the conductive film 416 is formed in the opening. A conductive film 422 electrically connected to the conductive film 421 and a conductive film 423 are formed over the insulating film 420.

An insulating film 424 is formed over the conductive films 422 and 423. A conductive film 425, a first ferromagnetic layer 426, an insulating film 427, and a second ferromagnetic layer 428 are sequentially stacked over the insulating film 424. A portion where the first ferromagnetic layer 426, the insulating film 427, and the second ferromagnetic layer 428 overlap with each other functions as the MTJ element 84.

An insulating film 429 is provided over the conductive film 425, the first ferromagnetic layer 426, the insulating film 427, and the second ferromagnetic layer 428, and a conductive film 431 is provided over the insulating film 429. The second ferromagnetic layer 428 is electrically connected to the conductive film 431 through an opening portion provided in the insulating film 429. In addition, an opening portion is provided in the insulating film 424 and the insulating film 429, and the conductive film 423 is electrically connected to the conductive film 431 through a conductive film 430 provided in the opening portion.

<Examples of Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 16A to 16F illustrate specific examples of these electronic devices.

Figure 16A:
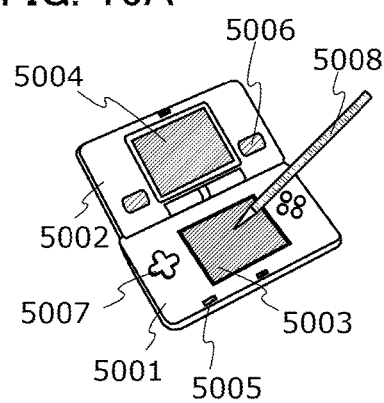
FIGS. 16A to 16F each illustrate an electronic device.

FIG. 16A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 16A has the two display portions 5003 and 5004, the number of display portions included in a portable game machine is not limited to this.

Figure 16B:
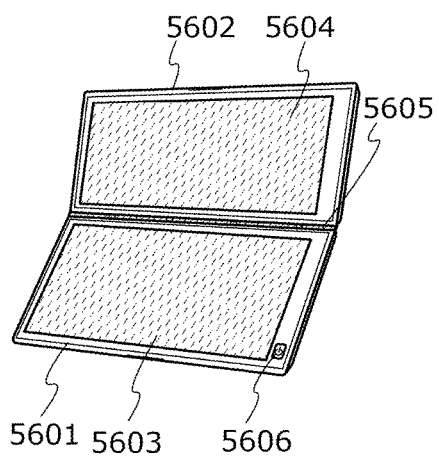

FIG. 16B illustrates a personal digital assistant, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 16C:
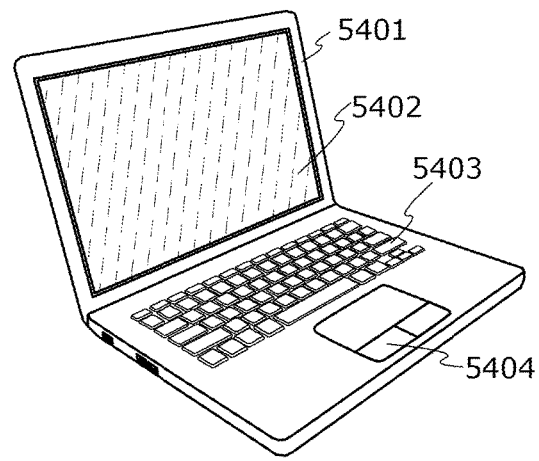

FIG. 16C illustrates a laptop personal computer, which includes a housing 5401, a display portion 5402, a keyboard 5403, a pointing device 5404, and the like. The semiconductor device of one embodiment of the present invention can be used for a variety of integrated circuits included in notebook personal computers.

Figure 16D:
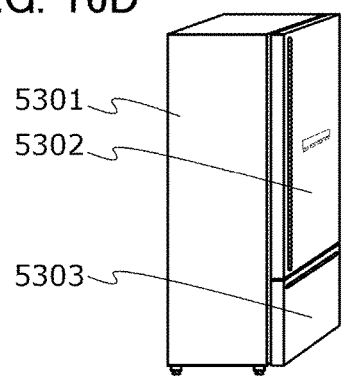

FIG. 16D illustrates an electric refrigerator-freezer, which includes a housing 5301, a door for a refrigerator 5302, a door for a freezer 5303, and the like. The semiconductor device of one embodiment of the present invention can be used for a variety of integrated circuits included in electric refrigerator-freezers.

Figure 16E:
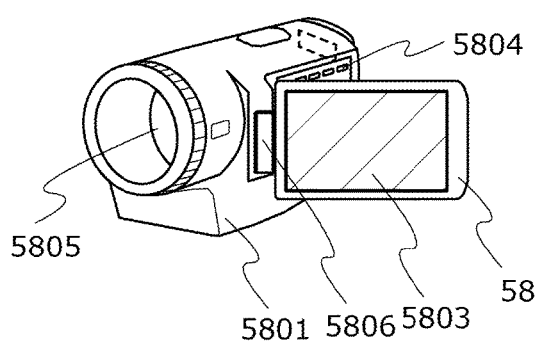

FIG. 16E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 16F:
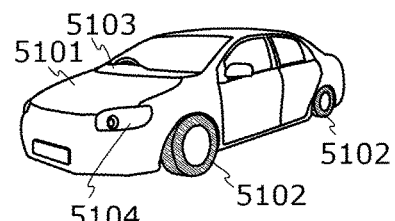

FIG. 16F illustrates an ordinary motor vehicle, which includes a car body 5101, wheels 5102, a dashboard 5103, lights 5104, and the like. The semiconductor device of one embodiment of the present invention can be used for a variety of integrated circuits included in automobiles.

This application is based on Japanese Patent Application serial no. 2014-022305 filed with Japan Patent Office on Feb. 7, 2014, the entire contents of which are hereby incorporated by reference.

What is claimed is:

1. A semiconductor device comprising:
    a memory circuit,
    wherein the semiconductor device is configured to store a start-up routine in the memory circuit and execute the start-up routine,
    wherein the semiconductor device is configured to operate the memory circuit as a buffer memory device after executing the start-up routine,
    wherein the semiconductor device is configured to load the start-up routine into the memory circuit from outside after operating the memory circuit as the buffer memory device and before the semiconductor device is fully powered off, and
    wherein the memory circuit comprises a memory element comprising a magnetic tunnel junction element.

2. The semiconductor device according to claim 1,
    wherein the semiconductor device is configured to measure a length of a period in which a supply of power to the semiconductor device is stopped,
    wherein the semiconductor device is configured to compare the length of the period with a length of a preset period after the supply of power,
    wherein the semiconductor device is configured to execute the start-up routine after loading the start-up routine into the memory circuit from outside when the period is longer than the preset period, and
    wherein the semiconductor device is configured to execute the start-up routine stored in the memory circuit before the semiconductor device is fully powered off when the period is shorter than the preset period.

3. The semiconductor device according to claim 1,
    wherein the memory circuit further comprises a first transistor, a second transistor, and a third transistor,
    wherein a gate of the first transistor is electrically connected to a first wiring,
    wherein one of a source and a drain of the first transistor is electrically connected to a second wiring,
    wherein the other of the source and the drain of the first transistor is electrically connected to the magnetic tunnel junction element,
    wherein a gate of the second transistor is electrically connected to the magnetic tunnel junction element,
    wherein one of a source and a drain of the second transistor is electrically connected to a third wiring, wherein the other of the source and the drain of the second transistor is electrically connected to one of a source and a drain of the third transistor,
wherein a gate of the third transistor is electrically connected to a fourth wiring, and
wherein the other of the source and the drain of the third transistor is electrically connected to a fifth wiring.

4. The semiconductor device according to claim 3, wherein the memory element further comprises a fourth transistor.

5. The semiconductor device according to claim 4, wherein at least one of the first transistor, the second transistor, the third transistor, and the fourth transistor comprises a channel formation region comprising an oxide semiconductor.

6. A semiconductor device comprising:
a memory circuit,
wherein the semiconductor device is configured to perform a first operation and perform a second operation,
wherein the semiconductor device is configured to be fully powered off between the first operation and the second operation,
wherein the semiconductor device is configured to store a start-up routine of the semiconductor device in the memory circuit before the first operation,
wherein the semiconductor device configured to execute the start-up routine in the first operation,
wherein the semiconductor device configured to perform an operation based on a setting according to a data stored in the memory circuit in the second operation, and
wherein the memory circuit comprises a memory element comprising a magnetic tunnel junction element.

7. The semiconductor device according to claim 6,
wherein the semiconductor device configured to measure a length of a period in which the semiconductor device is fully powered off,
wherein the semiconductor device configured to compare the length of the period with a length of a preset period after a supply of power,
wherein the semiconductor device configured to execute the start-up routine after loading the start-up routine into the memory circuit from outside when the period is longer than the preset period, and
wherein the semiconductor device configured to execute the start-up routine stored in the memory circuit before the semiconductor device is fully powered off when the period is shorter than the preset period.

8. The semiconductor device according to claim 6,
wherein the memory circuit operates as a buffer memory device in the second operation.

9. The semiconductor device according to claim 6, further comprising:
a logic circuit,
wherein the logic circuit comprises a plurality of circuits, and
wherein the memory circuit configured to control electrical connection between the plurality of circuits according to the data.

10. The semiconductor device according to claim 6,
wherein the memory circuit further comprises a first transistor, a second transistor, and a third transistor,
wherein a gate of the first transistor is electrically connected to a first wiring,
wherein one of a source and a drain of the first transistor is electrically connected to a second wiring,
wherein the other of the source and the drain of the first transistor is electrically connected to the magnetic tunnel junction element,
wherein a gate of the second transistor is electrically connected to the magnetic tunnel junction element,
wherein one of a source and a drain of the second transistor is electrically connected to a third wiring,
wherein the other of the source and the drain of the second transistor is electrically connected to one of a source and a drain of the third transistor,
wherein a gate of the third transistor is electrically connected to a fourth wiring, and
wherein the other of the source and the drain of the third transistor is electrically connected to a fifth wiring.

11. The semiconductor device according to claim 10, wherein the memory element further comprises a fourth transistor.

12. The semiconductor device according to claim 11, wherein at least one of the first transistor, the second transistor, the third transistor, and the fourth transistor comprises a channel formation region comprising an oxide semiconductor.

13. A semiconductor device comprising:
a memory circuit,
wherein the semiconductor device is configured to perform a first operation, being fully powered off, and then perform a second operation,
wherein the semiconductor device is configured to perform an operation based on a first setting according to a data stored in the memory circuit in the first operation,
wherein the semiconductor device configured to store a second setting of the semiconductor device in the memory circuit before the semiconductor device is fully powered off,
wherein the semiconductor device configured to execute a program for the second setting of the semiconductor device in the second operation, and
wherein the memory circuit comprises a memory element comprising a magnetic tunnel junction element.

14. The semiconductor device according to claim 13,
wherein the semiconductor device configured to measure a length of a period in which the semiconductor device is fully powered off,
wherein the semiconductor device configured to compare the length of the period with a length of a preset period after a supply of power, and
wherein the semiconductor device configured to execute the program for the second setting of the semiconductor device when the period is shorter than the preset period.

15. The semiconductor device according to claim 13,
wherein the memory circuit operates as a buffer memory device in the first operation.

16. The semiconductor device according to claim 15,
wherein the semiconductor device is configured to load a start-up routine into the memory circuit from outside after operating the memory circuit as the buffer memory device and before the semiconductor device is fully powered off.

17. The semiconductor device according to claim 13, further comprising:
a logic circuit,
wherein the logic circuit comprises a plurality of circuits, and
wherein the memory circuit configured to control electrical connection between the plurality of circuits according to the data.

18. The semiconductor device according to claim 13,
wherein the memory circuit further comprises a first transistor, a second transistor, and a third transistor,
wherein a gate of the first transistor is electrically connected to a first wiring,
wherein one of a source and a drain of the first transistor is electrically connected to a second wiring,
wherein the other of the source and the drain of the first transistor is electrically connected to the magnetic tunnel junction element,
wherein a gate of the second transistor is electrically connected to the magnetic tunnel junction element,
wherein one of a source and a drain of the second transistor is electrically connected to a third wiring,
wherein the other of the source and the drain of the second transistor is electrically connected to one of a source and a drain of the third transistor,
wherein a gate of the third transistor is electrically connected to a fourth wiring, and
wherein the other of the source and the drain of the third transistor is electrically connected to a fifth wiring.

19. The semiconductor device according to claim 13,
wherein the memory element further comprises a fourth transistor.

20. The semiconductor device according to claim 19,
wherein at least one of the first transistor, the second transistor, the third transistor, and the fourth transistor comprises a channel formation region comprising an oxide semiconductor.

* * * * *